United States Patent [19]

Imabayashi et al.

[11] Patent Number: 5,387,493
[45] Date of Patent: Feb. 7, 1995

[54] PHOTOSENSITIVE RESIN COMPOSITION FOR FORMING CONDUCTOR PATTERNS AND MULTILAYER CIRCUIT BOARDS USING SAME

[75] Inventors: Shinichiro Imabayashi; Hitoshi Oka, both of Yokohama; Isamu Tanaka, Yokosuka; Hiroshi Kikuchi, Zushi; Makio Watanabe, Fujisawa, all of Japan

[73] Assignee: Hitachi, Ltd., Tokyo, Japan

[21] Appl. No.: 599,428

[22] Filed: Oct. 18, 1990

[30] Foreign Application Priority Data

Oct. 25, 1989 [JP] Japan ................................. 1-275993

[51] Int. Cl.$^6$ ........................................... G03C 1/492
[52] U.S. Cl. ..................................... 430/280; 430/270; 430/271; 430/281; 430/286; 430/287
[58] Field of Search ............... 430/280, 281, 286, 287, 430/270, 271

[56] References Cited

U.S. PATENT DOCUMENTS

| | | | |
|---|---|---|---|
| 3,615,446 | 10/1971 | Wong | 430/281 |
| 3,989,610 | 11/1976 | Tsukada et al. | 430/288 |
| 4,252,883 | 2/1981 | Komura et al. | 430/55 |
| 4,268,614 | 5/1981 | Ueyama et al. | 430/315 |
| 4,382,118 | 5/1983 | Oka | 430/57 |
| 4,943,516 | 7/1990 | Kamayachi et al. | 430/280 |

Primary Examiner—Marion E. McCamish
Assistant Examiner—Mark A. Chapman
Attorney, Agent, or Firm—Antonelli, Terry, Stout & Kraus

[57] ABSTRACT

A resin composition for forming conductor patterns comprising a photo curable resin, a photopolymerization initiator, a thermosetting resin, agent for the thermosetting resin, photosensitive semiconductor particles, and if necessary a polyfunctional unsaturated compound is suitable for forming very fine conductor patterns in a build-up method.

16 Claims, 10 Drawing Sheets

PHOTOSENSITIVE RESIN COMPOSITION FOR FORMING CONDUCTOR PATTERNS AND MULTILAYER CIRCUIT BOARDS USING SAME

BACKGROUND OF THE INVENTION

This invention relates to a photosensitive resin composition for forming conductor patterns so as to realize a build-up method wherein a photosensitive resin composition coated on an insulating substrate is activated by exposing to light so as to have a catalyst selectively on the insulating substrate, followed by plating thereon to form conductor patterns, a multilayer printed circuit board using said resin composition, and a process for producing said multilayer printed circuit board.

With a remarkable development of the degree of integration in semiconductor integrated circuits and a development of surface mounting technique for directly mounting small chip parts, there has been demanded to form circuit conductors with higher density on printed circuit boards.

Higher density of printed circuit boards was attained by improving conductor density in a substrate plane heretofore. But in order to apply the recent developments of electronic parts and parts mounting technique mentioned above to such a demand, there is a limit in improving the density in a plane, and it becomes necessary to form a multilayer structure of circuit conductors by piling circuit conductors, that is, to form a so-called multilayer printed circuit board.

According to a previous technique, a multilayer printed circuit board was produced by etching a copper-clad laminate which has a copper foil on one side of an insulating substrate to form a circuit conductor, piling a number of such conductor-formed laminates with heating and pressing, drilling holes for through-holes and via holes, plating copper into these holes to connect individual conductors. But such a previous technique has the following disadvantages. (i) There takes place misregistration of individual conductor layers at the time of heating and pressing, resulting in mis-connection of individual conductor layers after copper plating. Thus the production cost increases with the number of conductor layers. For example, if the production cost for a two-layered printed circuit board is assumed 1, the production cost becomes 2 for four-layered board, 4 for six-layered board, 10 for eight-layered board. (ii) It is difficult to form very small through-holes and via holes by drilling, therefore the diameter of 0.3 mm is the limits. In order to improve the density of circuit conductors, it is desirable to make the diameter of holes smaller, said holes only having a function for connection. Recently, the diameter of holes is desired to make 0.2 to 0.1 mm for such a purpose. This is impossible according to the previous technique.

Taking the place of the previous technique, it has been proposed a so-called build-up method wherein insulating layers and circuit layers are piled alterately successively.

The build-up method has an advantage of forming very fine through-holes and via holes, since these through-holes and via holes are formed by a light exposure-developing method, a dry etching method using sputtering, etc. Further, since circuit conductor layers are successively laminated, misregistration of individual layers hardly takes place, resulting in a higher yield in production. But this method is still insufficient technically, so that this method is not used in practical production.

On the other hand, as conductor pattern forming methods for realizing the build-up method, there have been proposed the following methods.

Japanese Patent Examined Publication No. 50-40221 discloses a process for forming a printed circuit comprising mixing a metal powder which becomes a nucleus for electroless copper plating with a photosensitive resin, exposing the photosensitive resin to light in conductor pattern-wise to cure the resin, removing the photosensitive resin in unexposed portions, conducting electroless copper plating on the surface of conductor pattern-wisely exposed photosensitive resin to form a conductor pattern. But this method has the following disadvantages.

(i) In order to form conductor patterns by electroless copper plating, it is necessary to mix the metal powder, which becomes plating nucleus with the photosensitive resin, in an amount of equivalent weight or more to photosensitive resin. But when a large amount of metal powder is added to the photosensitive resin, the metal powder intercepts the light (generally ultraviolet light) for exposure so as to prevent the light from reaching deep portions of the resin layer. Thus, photocuring becomes inadequate in the deep portions of the resin layer. When the photosensitive resin in unexposed portions is removed (e.g. by spraying a solvent, developing and removing), the remaining resin layer (exposed portion) is damaged, or swollen to fail to obtain very fine conductor patterns.

(ii) When the metal powder is mixed in an amount of less than equivalent weight to the photosensitive resin, the number of plating nucleus becomes inadequate to electroless copper plating, resulting in spot-like deposition of copper. Therefore, good conductor patterns cannot be obtained.

Japanese Patent Examined Publication No. 56-36598 discloses a process for forming an electroconductive metal layer on an insulating substrate comprising mixing a thermosetting resin with a photosensitive semiconductor oxide particles such as $TiO_2$, $ZnO$, etc., coating the resulting thermosetting resin composition on a whole surface of a support (insulating substrate), semi-curing the thermosetting resin with heating, exposing the thermosetting resin conductor pattern-wise to light to deposit a noble metal, which becomes a plating nucleus, using electrons produced on the surface of $TiO_2$, $ZnO$ or the like by light exposure, forming a conductor pattern by electroless copper plating, and curing the thermosetting resin completely to generate adhesive strength between the conductor pattern and the thermosetting resin. But this method has the following disadvantages.

(i) Since the thermosetting resin per se has no pattern forming ability, it is necessary to form a pattern structure by screen printing. According to the screen printing, it is only possible to form a pattern with line width of about 0.5 mm at least, and it is impossible to form, for example, very fine via holes having a very small diameter of 0.1 mm.

(ii) When the thermosetting resin is cured with heating, flowing of the resin is generated to form a tough and fine skin layer on the surface thereof. An epoxy resin is a typical example of the thermosetting resin. In order to expose surfaces of the photosensitive semiconductor oxide particles over the resin, it is necessary to remove the skin layer. But in practice, it is impossible to remove the skin layer. Thus, an etching method is employed during semi-cured state. But since the thermosetting reaction is so rapid that a constant semi-cured state cannot be obtained, resulting in failing to form conductor patterns stably.

SUMMARY OF THE INVENTION

It is an object of the present invention to provide a photosensitive resin composition for forming conductor patterns overcoming the disadvantages mentioned above. It is another object of the present invention to provide a multilayered printed circuit board obtained by using such a photosensitive resin composition, and to provide a process for producing such a multilayered printed circuit board.

The present invention provides a photosensitive resin composition for forming conductor patterns comprising a photo curable resin, a photo-polymerization initiator, a thermosetting resin, a curing agent for the thermosetting resin, photosensitive semiconductor particles, and if necessary a polyfunctional unsaturated compound.

The present invention further provides a multilayer printed circuit board comprising an insulating substrate, first conductor layer patterns formed on both sides of the insulating substrate, second conductor layer patterns formed on the first conductor layer patterns individually via interlaminer insulating layers, individual first and second conductor layer patterns being electrically connected via through-holes and/or via holes, at least one of conductor layer patterns being obtained by forming an interlaminer insulating layer using the photosensitive resin composition of the present invention and subjecting the surface of the interlaminer insulating layer to electroless plating.

The present invention further provides a process for producing a multilayer printed circuit board which comprises (a) drilling holes for through-holes at desired portions of a substrate, (b) forming a first conductor layer pattern, (c) forming a layer of a photosensitive resin composition of the present invention on the first conductor layer pattern at the desired portions, or forming an interlaminer insulating layer formed on the first conductor layer pattern using a photosensitive resin, followed by forming a layer of the photosensitive resin composition on the interlaminer insulating layer, (d) coating a metallic ion solution for forming plating nuclea on a patterned photosensitive resin composition layer, which is exposed to light for activation for electroless plating by reducing metallic ions on the exposed region, and (e) forming a second conductor layer pattern on the exposed region by electroless plating, and plated via holes and plated through-holes simultaneously, and if necessary (f) forming a photo solder resist layer on the desired portions of the second conductor layer and via holes.

DESCRIPTION OF THE PREFERRED EMBODIMENTS

Figure 1:
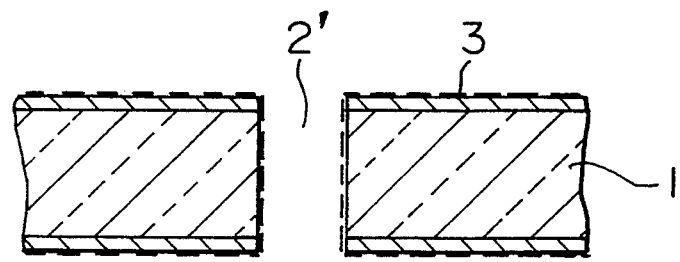
FIGS. 1 to 5 illustrate various stages in the production of multilayer printed circuit boards in accordance with embodiments of the present invention.
Figure 1:
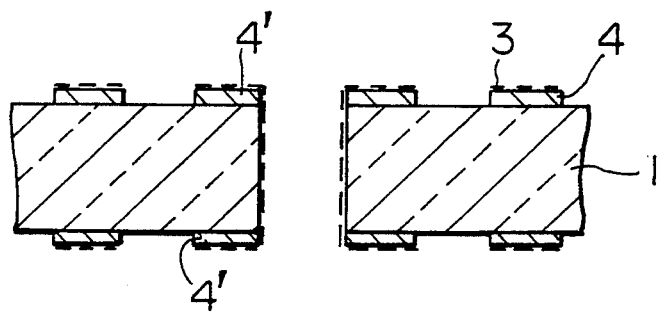
Figure 1:
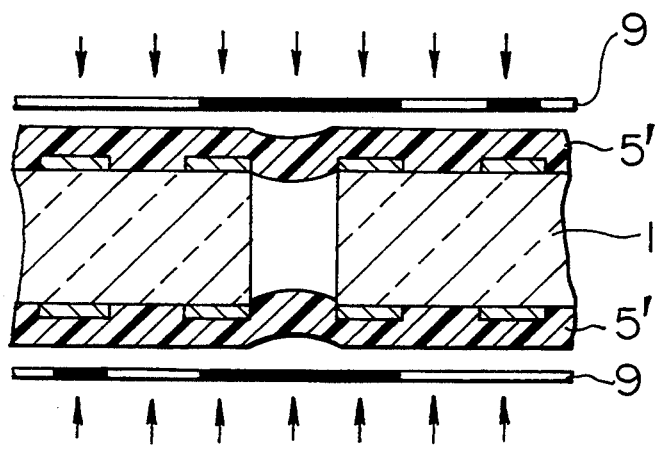
Figure 1:
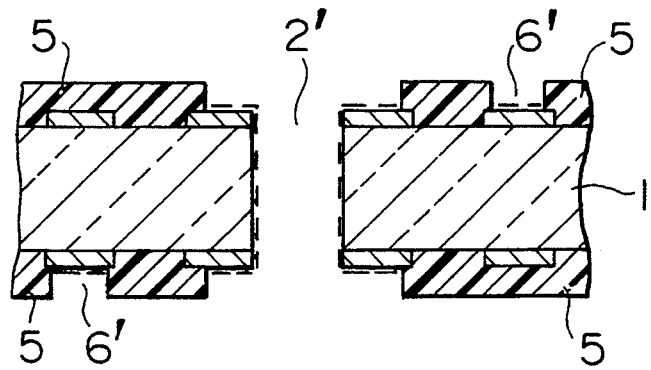
Figure 1:
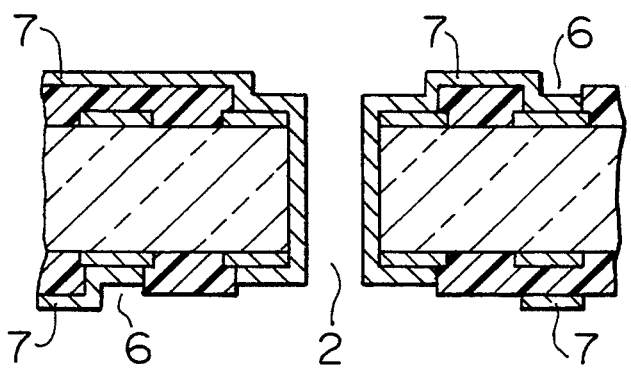
Figure 1:
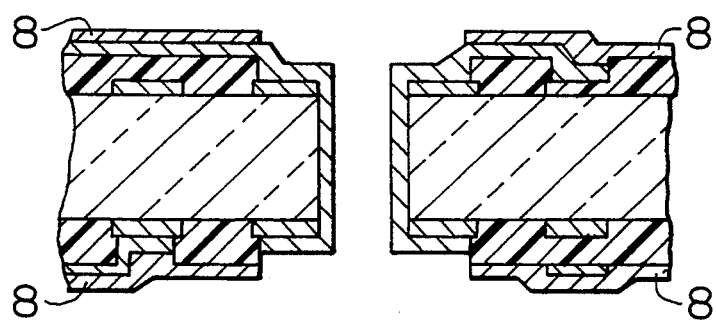

According to the present invention, there can be obtained the following effects.

(1) Since the photosensitive resin which is cured by ultraviolet light is used, a cross-linking reaction takes place by irradiation of ultraviolet (UV) light of 300 to 400 nm suitable for producing printed circuit boards so as to cure only the irradiated portions. When unexposed portions are removed by developer, very fine circuit patterns, through-holes and via holes can be formed.

(2) Difference of solubility for a developer between the cured portion and uncured portion by UV irradiation in the photosensitive resin composition is suitable for pattern formation. Surfaces of the cured portions of the photosensitive resin are suitably removed by the developing solution to expose the photosensitive semiconductor particle included in the photosensitive resin composition. By this, stable formation of plating nucleus becomes possible, resulting in capable of producing conductor patterns by electroless copper plating stably.

(3) Since the photosensitive resin used in the resin composition of the present invention has good heat resistance at a temperature of soldering electronic parts (e.g. 260° C. for 10 seconds), the multilayer printed circuit board obtained by the build-up method also has good heat resistance.

(4) Since the resin composition of the present invention contains not only the photosensitive resin but also the thermosetting resin, there can be obtained strong adhesion, which cannot be obtained by using only photosensitive resin. By this, the photosensitive semiconductor particles can strongly be retained in the photosensitive resin composition. That is, the adhesive strength between the photosensitive resin composition and the conductor patterns is sufficient for practical use.

(5) The photosensitive semiconductor particles contained in the resin composition of the present invention do not prevent photo curing of the resin composition at the UV irradiation. Thus, the photosensitive resin can strongly be photo cured even in deep portions so as to form very fine conductor patterns.

(6) Since the photosensitive semiconductor particles contained in the resin composition can deposit a large amount of noble metal which becomes a plating nucleus, an electroless copper plating reaction becomes possible even on very fine conductor patterns to form very fine conductors.

(7) Since the resin composition of the present invention comprising a photosensitive resin, a thermosetting resin and photosensitive semiconductor particles is good in coating properties, coating of uniform thickness and without voids on a whole surface of circuit board by screen printing, roll coating, etc. becomes possible.

(8) Since the resin composition of the present invention comprising a photosensitive resin, a thermosetting resin and photosensitive semiconductor particles can be exposed to UV light through a negative mask adjacent to the resin composition, production of conductor patterns on a circuit board having a large area becomes possible.

The photosensitive resin composition for producing conductor patterns comprises a photo curable resin, a photopolymerization initiator, a thermosetting resin, a curing agent for the thermosetting resin, photosensitive semiconductor particles, and if necessary a polyfunctional unsaturated compound.

As the photo curable resin, there can be used a diallyl phthalate prepolymer.

As the polyfunctional unsaturated compound, there can be used a compound having at least two ethylenic linkages in the molecule.

As the thermosetting resin, there can be used epoxy resins, phenolic resins and polyimide resins. Among them, the use of epoxy resins together with curing agents therefor is preferable. When an epoxy resin is used as the thermosetting resin, it is preferable to use a compound which can react with the epoxy resin and improve adhesiveness to plated conductor pattern (mainly copper foil pattern) depending on purposes.

As the photosensitive semiconductor particles which are dispersed, preferably uniformly dispersed, in a base resin composition containing a photo curable resin, a polyfunctional unsaturated compound, a photopolymerization initiator, a thermosetting resin, and a curing agent for the thermosetting resin, there can be used particles which are insulators at normal time but produce electrons and holes by irradiation with light, the produced electrons having a function of reducing metal ions to deposit a metal which is a plating nucleus (i.e. plating catalyst) at the time of forming conductor plating pattern. Examples of the photosensitive semiconductor particles are $TiO_2$, ZnO, CdS, etc., alone or as a mixture thereof. It is preferable to use the photosensitive semiconductor particles having an electron donor on the surfaces thereof, said electron donor having a function of consuming the holes when the electrons and holes are produced as mentioned above by irradiation of light.

The above-mentioned base resin composition is explained more in detail below.

DIALLYL PHTHALATE PREPOLYMER

The diallyl phthalate prepolymer includes at least one prepolymer of diallyl orthophthalate and dially isophthalate, and/or diallyl terephthalate prepolymer. Practically preferable molecular weight of the diallyl phthalate prepolymer is 3000 to 30,000. Such a prepolymer is called as a $\beta$-polymer.

Detailed properties of the diallyl phthalate prepolymer and processes for production thereof are described, for example, in Naoyoshi Yoshimi: "Diallyl Phthalate Resins" published by Nikkan Kogyo Shinbun Co., Ltd. (1969). The diallyl phthalate prepolymer may contain remaining or produced diallyl phthalate monomer and $\gamma$-polymer having a three-dimensional cross-linking structure in small amounts.

POLYFUNCTIONAL UNSATURATED COMPOUND

The polyfunctional unsaturated compound means compounds having at least two ethylenic linkages in the molecule. Examples of the polyfunctional unsaturated compound are compounds obtained by esterification reaction of an unsaturated carboxylic acid with a dihydric or higher polyhydroxy compound, epoxy acrylates and epoxy methacrylates.

As the unsaturated carboxylic acid, there can be used acrylic acid, methacrylic acid, iraconic acid, crotonic acid, maleic acid, etc.

As the dihydric or higher polyhydroxy compound, there can be used ethylene glycol, propylene glycol, triethylene glycol, hydroquinone, pyrogallol, etc.

Examples of the compounds obtained by esterification reaction of the unsaturated carboxylic acid and the polyhydroxy compound are diacrylates, triacrylates, dimetacrylates and trimethacrylates such as diethylene glycol diacrylate, polyethylene glycol diacrylate, neopentyl glycol diacrylate, 1,5-pentanediol diacrylate, 1,6-hexanediol diacrylate, trimethylolpropane triacrylate, pentaerythritol triacrylate, pentaerythritol trimethacrylate, diethylene glycol dimethacrylate, trimethylolpropane trimethacrylate, 1,3-butanediol dimethacrylate, etc.; polyvalent acrylates and methacrylates such as tri-, tetra-, penta-, hexa-acrylates and methacrylates of dipentaerythritol, tri-, tetra-, penta-, hexa-acrylates and methacrylates of sorbitol, oligoester acrylates, oligoester methacrylates, epoxy (meth)acrylates obtained by reacting an epoxy resin with acrylic acid or methacrylic acid, etc. Among them, trimethylolpropane triacrylate, trimethylolpropane trimethacrylate, pentaerythritol triacrylate, pentaerythritol trimethacrylate, tri-, tetra-, penta- and hexa-acrylates of dipentaerythritol and tri-, tetra-, penta- and hexa-acrylates of dipentaerythritol are preferable for more rapid curing.

It is also possible to use monofunctional unsaturated compounds.

These polyfunctional unsaturated compounds can be used alone or as a mixture thereof.

PHOTOPOLYMERIZATION INITIATOR

As the photopolymerization initiator, there can be used acetophenone and derivatives thereof, benzophenone and derivatives thereof, Michler's ketone, benzil, benzoin, benzoin alkyl ethers, benzyl alkyl ketals, thioxanthone and derivatives thereof, anthraquinone and derivatives thereof, tetramethyl thiurammonosulfide, 1-hydroxycyclohexyl phenyl ketone, 2-methyl-1-[4-(methylthio)phenyl]-2-morpholino-propene-1 and the like $\alpha$-amino ketone compounds, etc., alone or as a mixture thereof. Among them, benzoyl alkyl ethers, thioxanthone derivatives, 2-methyl-1-[4-(methylthio)phenyl]-2-morpholino-propene-1 and the like $\alpha$-amino ketone compounds are preferable for more rapid curing. Further, 2-methyl-1-[4-(methylthio)phenyl]-2-morpholino-propene-1 is more preferable due to rapid curing as well as good storage stability.

It is possible to use together an amine compound for sensitizing the action of photopolymerization initiator.

EPOXY RESIN

As the epoxy resin, epoxy resins having two epoxy groups per molecule in average are preferable. Examples of the epoxy resin are polyglycidyl ethers or polyglycidyl esters obtained by reacting a polyhydric phenol such as bisphenol A, halogenated bisphenol A, catechol, resorcinol, etc., or a polyhydric alcohol such as glycerine with epichlorohydrin in the presence of a basic catalyst; epoxy novolaks obtained by condensing a novolak type phenol resin and epichlorohydrin; epoxidized polyolefines obtained by epoxidizing by a peroxide method; epoxidized polybutadienes; oxides derived from dicyclopentadiene; and epoxidized vegetable oils. These epoxy resins can be used alone or as a mixture thereof.

CURING AGENT FOR EPOXY RESIN

As the curing agent for epoxy resins, there can be used actural curing agents which are insoluble in epoxy resins at a resin drying temperature of 80° C. and dissolves at high temperatures to begin curing, and latent curing agents.

Examples of the curing agent are aromatic polyamines and hydroxyethylated derivatives thereof such as metaphenylenediamine, 4,4'-diaminodiphenylmethane, 4,4'-diaminodiphenylsulfone, 4,4'-diaminodiphenyl oxide, 4,4'-diaminodiphenylimine, biphenylenediamine, etc.; dicyandiamide; imidazole compounds such as 1-methylimidazole, 2-methylimidazole, 1,2-dimethylimidazole, 2-ethyl-4-methylimidazole, 2-undecylimidazole, 2-heptadecylimidazole, 1-benzyl-2-methylimidazole, 2-phenylimidazole, 1-(2-carbamyl)-2-ethyl-4-methylimidazole, 1-cyanoethyl-2-phenyl-4,5-di(cyanoethoxymethyl)imidazole, 2-methylimidazole isocyanuric acid adduct, 2-phenylimidazole isocyanuric acid adduct, 1-cyanoethyl-2-methylimidazole, 1-cyanoethyl-2-ethyl-4-methylimidazole, 1-azinethyl-2-ethyl-4-imidazole, 2-methyl-4-ethyl-imidazole trimesic acid adduct, etc.; $BF_3$ amine complex compounds; acid anhydrides such as phthalic anhydride, methyltetrahydrophthalic anhydride, methylnadic anhydride, dodecylsuccinic anhydride, chlorendic anhydride, pyromellitic anhydride, benzophenonetetracarboxylic anhydride, trimellitic anhydride, polyazelaic anhydride, polysebacic anhydride, etc.; organic acid hydrazides such as adipic dihydrazide, etc.; diaminomaleonitrile and derivatives thereof; melamine and derivatives thereof; amine imides, etc.

It is also possible to use a diaminotriazine modified imidazole compound of the formula:

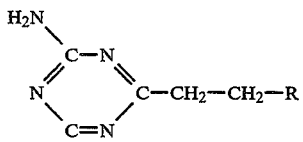

wherein R is a residue of imidazole compound. Examples of such a compound are 2,4-diamino-6{2'-methylimidazole-(1')}ethyl-s-triazine, 2,4-diamino-6{2'-ethyl-4'-methylimidazole-(1')}ethyl-s-triazine, 2,4-diamino-6{2'-undecylimidazole-(1')}ethyl-s-triazine, 2,4-diamino-6{2'-methylimidazole(1')}ethyl-s-triazine, and isocyanuric acid adducts thereof.

Among these curing agents, a combination of a diaminotriazine modified imidazole and dicyandiamide is particularly preferable from the viewpoint of adhesiveness to formed conductor patterns.

COMPOUND CAPABLE OF REACTING WITH EPOXY RESIN AND IMPROVING ADHESIVENESS TO CONDUCTOR PATTERN (COPPER FOIL)

A compound capable of reacting with an epoxy resin and improving adhesiveness to conductor pattern (e.g. copper foil) is effective for improving adhesiveness to conductor pattern layer formed by plating when the resin composition of the present invention is cured by light exposure, followed by formation of interlaminer insulating layers.

Examples of such a compound are thiazolines such as 2-mercaptothiazoline, thiazoline, L-thiazoline-4-carboxylic acid, 2,4-thiazolinedione, 2-methylthiazoline, etc.; thiazoles such as thiazole, 4-ethylthiazole, etc.; thiadiazoles such as 2-amino-5-mercapto-1,3,4-thiadiazole, 2,5-dimercapto-1,3,4-thiadiazole, etc.; imidazoles such as 2-mercaptobenzoimidazole, 2-mercapto-1-methylimidazole, etc.; imidazolines such as 2-mercaptoimidazoline, etc.; 1-H-1,2,4-triazole-3-thiol, etc. Among them, 2-mercaptothiazoline, 2-mercaptoimidazoline, thiazoline, 2-amino-5-mercapto-1,3,4-thidiazole, and 1-H-1,2,4-triazole-3-thiol are more effective for improving the adhesiveness between the resin layer and the conductor pattern such as copper foil, etc.

The base resin composition used in the present invention may contain one or more additives such as organic solvents as diluent for improving workability, antifoaming agents, fillers, thixotropic agents, etc.

As the organic solvents, there can be used those having high boiling temperatures and low in volatility such as Cellosolve, Cellosolve acetate, methyl Cellosolve, butyl Cellosolve, carbitol, methyl carbitol, butyl carbitol, terpineol, ethyl Cellosolve acetate, butyl Cellosolve acetate, etc. Among them, Cellosolve acetate and butyl Cellosolve acetate are particularly preferable for easily adjusting the viscosity of resin composition and printing. It is also possible to use solvents having a low boiling point such as acetone, methyl ethyl ketone, ethanol, and the like.

The anti-foaming agent is used for removing bubbles introduced at the-time of resin printing. Examples of the anti-foaming agent are siloxane linkage-containing organic silicon compounds such as silicone oil.

The filler is added for improving printing properties of the resin and improving the adhesiveness of the resin layer. Examples of the filler are fine powders of insulating materials such as silica, alumina, talc, etc.

The thixotropic agent is used for improving the viscosity, particularly thixotropic properties of the resin composition. As the thixotropic agent, ultrafine powder of silica is preferably used.

As mentioned above, the resin composition of the present invention includes the photosensitive semiconductor particles which form plating catalyst for electroless plating at the time of forming conductor patterns.

As the photosensitive semiconductor particles, there can be used particles of oxide semiconductors such as $TiO_2$, $ZnO$, etc. and particles of sulfide semiconductors such as $CdS$, etc.

Generally speaking, there can be used those having the following properties. A first property that is required is to be an insulating body at normal time but to be able to absorb light effectively and to release electrons at the time of irradiation of light. A second property that is require is to be a stable compound which does not decompose at a curing temperature of the thermosetting resin and preferably to have a light absorption wavelength region different from that of the resins (in order to not lower curing of the resins). Practically preferable particle size is 0.1 to 7 μm.

The photosensitive semiconductor particles as very fine particles are dispersed in the base resin composition. When the resulting base resin composition is photo cured by exposing to UV light and non-exposed portions are developed, followed by exposing to light having an energy larger than the energy gap of the semiconductor in the co-presence of a metal salt whose metal can be a plating catalyst such as platinum, gold, palladium, silver, copper, etc., the above-mentioned metals can selectively be deposited only on the exposed regions of the photo curable resin. The exposure to light in the presence of the above-mentioned metal salts can be carried out, for example, by coating a metal salt solution after the formation of photo curable resin pattern, and exposing to light according to the conductor pattern on the resin pattern. The thus produced metal or that obtained by substituting with a noble metal such as palladium becomes a plating catalyst. In the present invention, since the plating catalyst is produced only in the light exposed region to impart plating activity different from the case of dispersing metal powder previously in the resin, plating activity can be obtained selectively on the resin.

When the photosensitive semiconductor particles are used together with a dye having absorption in the visible region such as Rose Bengal, sensitivity can be improved by enlarging the photosensitive wavelength region.

Improvement in sensitivity can also be accomplished by forming metal nucleus by irradiation of light in the co-presence of an electron donor. More concretely, when a semiconductor is exposed to light, a metal salt coated on the resin are reduced to the corresponding metal to form plating catalyst. In this case, sensitivity can be improved by using a semiconductor powder having an electron donor previously bonded to a surface of the semiconductor powder, or using a semiconductor provided with an electron donor and a metal salt. The latter method is preferred in the case of a semiconductor other than the metal oxide.

The electron donor reacts with holes generated on the semiconductor surface at the time of light exposure and consumes the holes. By this, back reaction of the holes with the electrons produced can be prevented, resulting in effectively applying the electrons to reduction of metal ions.

Examples of the electron donor are lower aliphatic alcohols such as methanol, ethanol, propanol, butanol, etc.; aromatic alcohols such as benzyl alcohol, etc.; cyclic ethers such as tetrahydrofuran, etc.; amines such as triethylamine, triethanolamine, N-methylpyridine, N-methylpiperazine, N-methylmorpholine, etc.; lower aliphatic carboxylic acids such as acetic acid, propionic acid, etc.; amides derived from these compounds; nitriles such as acetonitrile, propionitrile, etc.; and the like.

The electron donor can be bonded to surfaces of semiconductor oxides such as $TiO_2$, ZnO, etc., by a direct bonding method by using an amide linkage, an ester linkage, etc. so as to bond to hydroxyl groups present on the surfaces of semiconductors. It is also possible to bond the electron donor to surfaces of semiconductors via a suitable coupling agent.

Examples of the coupling agent are silane coupling agents having organic functional groups such as an amino group, e.g. $\gamma$-aminopropyltriethoxysilane, N-$\beta$-(aminoethyl)-$\gamma$-aminopropyltrimethoxysilane, $\gamma$-ureidopropyltriethoxysilane, N-phenyl-3-aminopropyltrimethoxysilane, $\gamma$-anilinopropyltrimethoxysilane, etc.; amino group-containing titanate coupling agents such as isopropyltri(N-amidoethylaminoethyl) titanate, etc.; zircoaluminate coupling agents having a carboxylic acid and amine as functional groups, etc. Since these coupling agents have the electron donor as functional group, they can be used by bonding to the hydroxyl groups on the surfaces of semiconductors. Further, in the case of $\gamma$-chloropropyltrimethoxysilane, after bonding to the hydroxyl group on the surface of semiconductor, the chloro group can be bonded to a nitrile, an amine, a carboxylic acid, etc. by a dehydrochlorination reaction or desalting reaction. The bonding of the above-mentioned coupling agents to surfaces of oxide semiconductors can be carried out by conventional processes.

The electron donor together with a metal salt can be provided on semiconductor surfaces by dissolving the electron donor in an aqueous solution of metal salt followed by coating on the surfaces, or dissolving the electron donor in a suitable organic solvent, followed by coating together with the aqueous solution of metal salt.

The photosensitive resin composition of the present invention preferably comprises 100 parts by weight of the photo curable resin, 0 to 30 parts by weight of the polyfunctional unsaturated compound, 0.5 to 12 parts by weight of the photopolymerization initiator, 3 to 35 parts by weight of the thermosetting resin, and 10 to 150 parts by weight of the photosensitive semiconductor particles.

The photosensitive resin composition of the present invention more preferably comprises 100 parts by weight of the diallyl phthalate prepolymer, 4 to 30 parts by weight (particularly preferably 10 to 20 parts by weight) of the polyfunctional unsaturated compound, 0.5 to 12 parts by weight (particularly preferably 1 to 5 parts by weight) of the photopolymerization initiator, 3 to 35 parts by weight (particularly preferably 15 to 25 parts by weight) of the thermosetting resin, 10 to 150 parts by weight (particularly preferably 30 to 80 parts by weight) of the photosensitive semiconductor particles, and when the thermosetting resin is an epoxy resin, 2 to 30 parts by weight (particularly preferably 5 to 15 parts by weight) of a curing agent for the epoxy resin per 100 parts by weight of the epoxy resin, and 1 to 35 parts by weight (particularly preferably 10 to 20 parts by weight) of a compound which can chemically reacts with the epoxy resin and improves adhesiveness to conductor patterns such as copper foil per 100 parts by weight of the epoxy resin.

When the amounts of individual components are lower than the lower limits mentioned above, there is a tendency to lower the photo-sensitivity of the resin composition and to lower adhesiveness to conductors. On the other hand, when the amounts of individual components are higher than the upper limits mentioned above, there is a tendency to lower adherent light exposure properties and to make curing of the resin composition insufficient.

According to the present invention, a multilayer printed circuit board can be produced by (a) drilling holes for through-holes at desired portions of a substrate, (b) forming a first conductor layer pattern preferably by a photo etching method, (c) forming a layer of a photosensitive resin composition of the present invention on the first conductor layer pattern at the desired portions, or forming an interlaminer insulating layer formed on the first conductor layer pattern using a photosensitive resin, followed by forming a layer of a photosensitive resin composition of the present invention on an interlaminer insulating layer, (d) coating a metallic ion solution for forming plating nuclea on a patterned photosensitive resin composition layer, which is exposed to light for activation for electroless plating by reducing metallic ions on the exposed region, (e) forming a second conductor layer pattern on the exposed region, via holes and through-holes simultaneously, by electroless plating, and if necessary (f) forming a photo solder resist layer on the desired portions of the second conductor layer and via holes.

By repeating the steps (c) to (e) one or more times, there can be obtained multilayer printed circuit boards having the desired number of lamination.

As the substrate, there can be used insulating substrate and double-sided copper-clad laminates (insulating substrates) conventionally used. Depending on the kinds of insulating substrates used, treating steps are slightly changed as explained in detail below.

One embodiment of the process for producing a multilayer printed circuit board comprises (a) drilling holes for through-holes at desired portions of a double-side copper-clad insulating substrate and activating inner walls of the holes for electroless plating, (b) forming a first conductor layer pattern by a photo etching method, (c) forming an interlaminer insulating layer having one or more via holes and holes for through-holes by pattern-wise exposure using a photosensitive resin, (d) forming a layer of a photosensitive resin composition of the present invention for forming conductor patterns on the insulating layer at desired portions, and (e) forming a second conductor layer pattern by electroless plating and forming plated via holes and plated through-holes simultaneously, and if necessary, (f) forming a photo solder resist layer on the desired portions of the second conductor layer and the via holes This process is explained concretely referring to FIG. 1.

In FIG. 1(A), a hole 2' is drilled in a double-sided copper-clad laminate 1 for forming a through-hole (plated) 2. The copper-clad laminate 1 is dipped in a catalyst solution of Sn/Pd so as to adhere an activating catalyst 3 on the copper foil surfaces and the inner wall of the hole 2' so as to make electroless plating possible.

In FIG. 1(B), lands 4' around the opening portion of the hole 2' and first conductor layers 4 are formed by a photo etching method.

In FIG. 1(C), a photo polymer (photosensitive resin) 5' which is capable of forming a thick film and has resistance to plating reaction is coated on the whole surfaces of the laminate 1 by a screen printing method or using a roll coater. After subjecting to preliminary drying, adherent exposure to UV light via a mask 9 is carried out to cure portions other than holes for via holes 6', hole 2' and lands 4'.

In FIG. 1(D), a solvent is sprayed to carry out development and to form interlaminar insulating layers 5.

In FIG. 1(E), using the resin composition of the present invention, second conductor layers 7, via holes 6 and through hole 2 are formed by electroless copper plating.

In FIG. 1(F), a photo solder resist 8 is coated on desired portions of the second conductor layers 7 to give a multilayer printed circuit board.

By repeating the steps shown in FIGS. 1(C) to 1(E) (the steps (c) to (e)) one or more times, there can be obtained a multilayer printed circuit board having a large number of laminates.

Another embodiment of the process for producing a multilayer printed circuit board comprises (a) drilling holes for through-holes at desired portions of a double-sided copper-clad insulating substrate and activating inner walls of the holes for electroless plating, (b) forming a first conductor layer pattern by a photo etching method, (c) forming an interlaminer insulating layer having one or more via holes and holes for through-holes by pattern-wise exposure using a photosensitive resin, (d) forming a layer of a photosensitive resin composition of the present invention for forming conductor patterns on the insulating layer except for a part of the via holes and the holes for through-holes in pattern-like, (e) coating a metallic ion solution for forming plating nuclea on the patterned photosensitive resin composition layer, which is exposed to light on the whole surface for activation for electroless plating by reducing metallic ions on the exposed region, and (f) forming a second conductor layer pattern on the exposed region by electroless plating and forming plated via holes and plated through-holes simultaneously.

If necessary, a photo solder resist layer can be formed on the desired portions of the second conductor layers and the via holes.

This process is explained referring to FIGS. 2(A) to 2(I).

FIG. 2(A) to FIG. 2(D) are the same as FIG. 1(A) to FIG. 1(D).

Figure 2A:
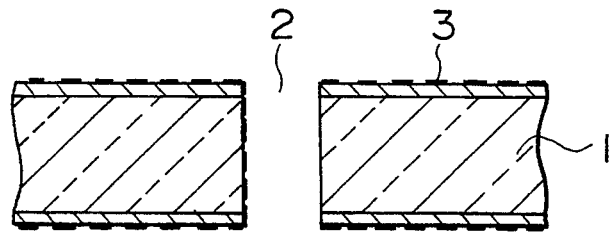
Figure 2B:
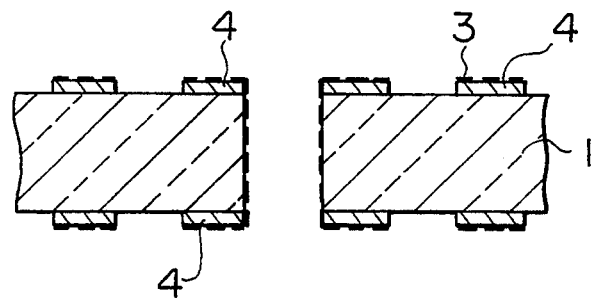
Figure 2C:
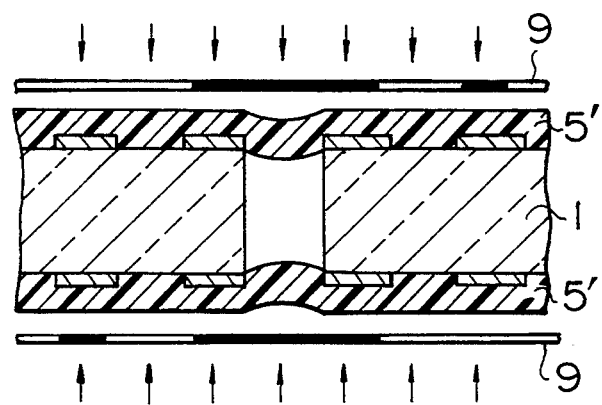
Figure 2D:
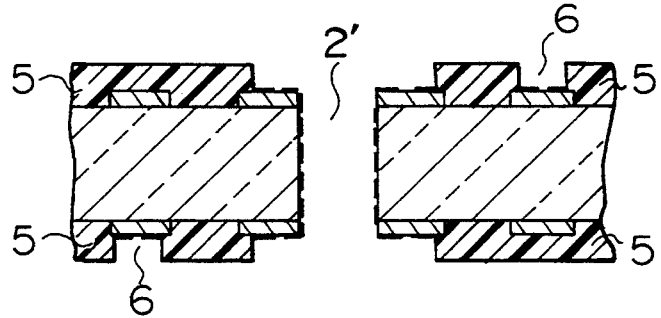
Figure 2E:
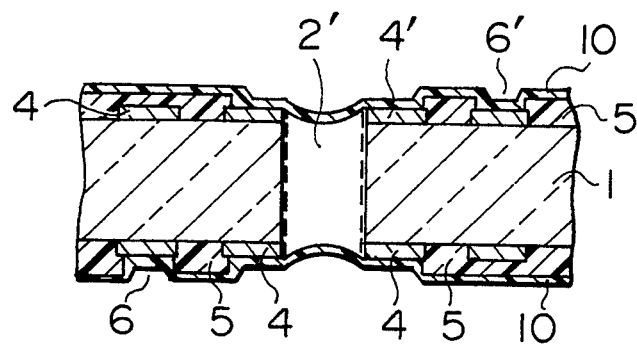

In FIG. 2(E), the resin composition 10 of the present invention for forming conductor pattern is coated on the whole surfaces of the interlaminer insulating layer 5.

Figure 2F:
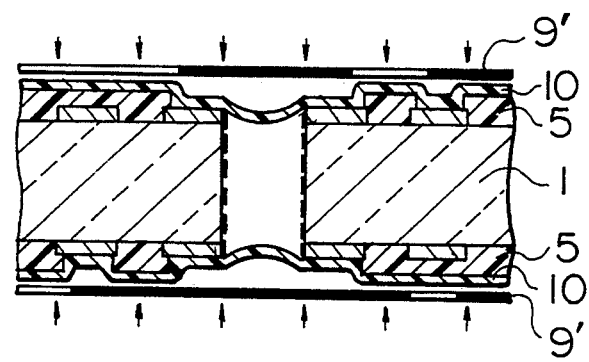

In FIG. 2(F), the resin composition 10 is exposed to UV light via a negative mask 9' for forming second conductor layers.

Figure 2G:
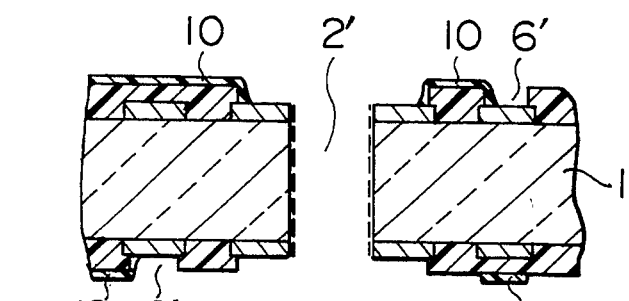

In FIG. 2(G), development is carried out to form resin layers 10 in the form of second conductor patterns except for the holes 6' for via holes, the hole 2' for through-hole, and the lands 4'.

Figure 2H:
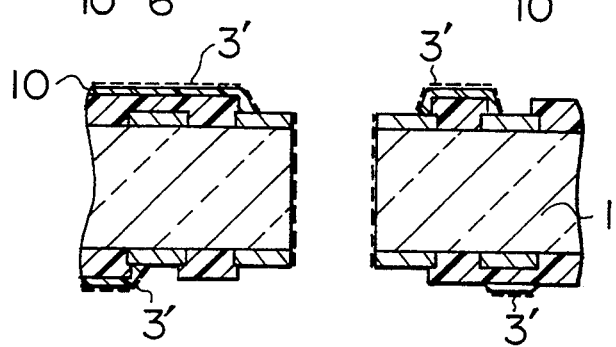

In FIG. 2(H), surfaces of the resin layers 10 are roughened. Then, a solution of metal salt which becomes plating nuclea in a later stage is coated on the roughened surfaces, followed by exposure of the whole surfaces of resin layers to UV light to form a plating catalyst 3'.

Figure 2I:
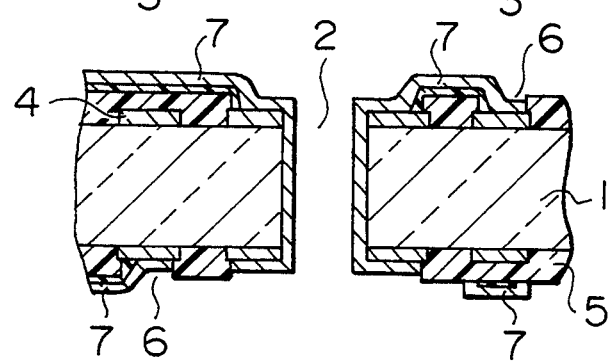

In FIG. 2(I), electroless copper plating is carried out on the activated portions by the catalyst 3' to form second conductor layers 7 and simultaneously to form via holes 6 and through-hole 2.

By repeating the steps shown in FIGS. 2(C) to 2(I) (the steps (c) to (f)) one or more times, there can be obtained a multilayer printed circuit board having a large number of laminates.

A further embodiment of the process for producing a multilayer printed circuit board comprises (a) drilling holes for through-holes at desired portions of a double-sided copper-clad insulating substrate and activating inner walls of the holes for electroless plating, (b) forming a first conductor layer pattern by a photo etching method, (c) forming an interlaminer insulating layer having one or more via holes and holes for through-holes by pattern-wise exposure using a photosensitive resin, (d) forming a layer of a photosensitive resin composition of the present invention for forming conductor patterns on the insulating layer except for a part of the via holes and the holes for through-holes in pattern-like, (e) coating a metallic ion solution for forming plating nuclea on the patterned photosensitive resin composition layer, which is selectively exposed to light on a part of the surface for activation for electroless plating by reducing metallic ions on the exposed region, and (f) forming a second conductor layer pattern on the exposed region by electroless plating and forming plated via holes and plated through-holes simultaneously.

If necessary, a photo solder resist layer can be formed on the desired portions of the second conductor layers and the via holes.

This process is explained referring to FIGS. 3(A) to 3(I).

FIG. 3(A) to FIG. 3(D) are the same as FIG. 1(A) to FIG. 1(D).

Figure 3A:
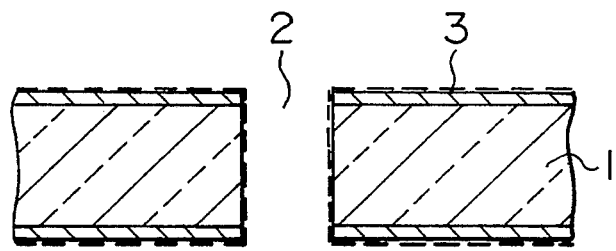
Figure 3B:
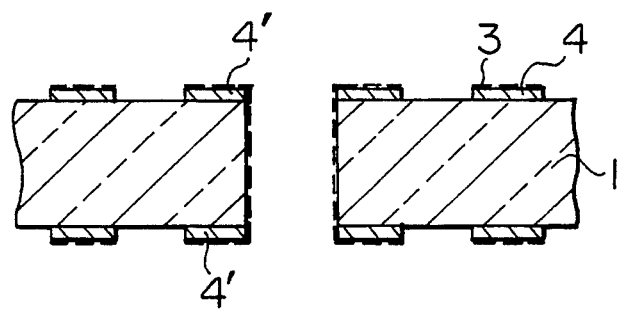
Figure 3C:
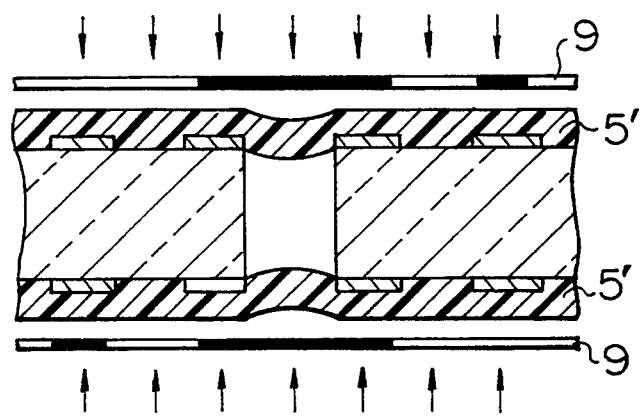
Figure 3D:
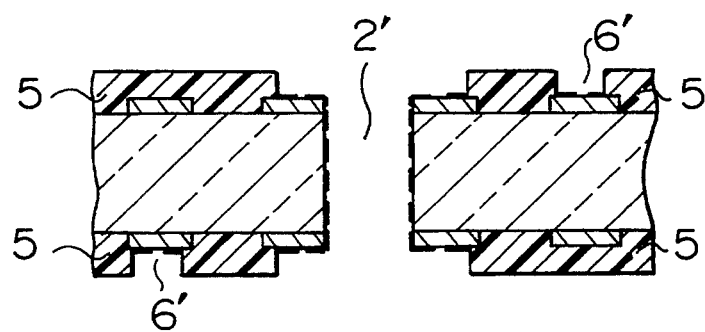
Figure 3E:
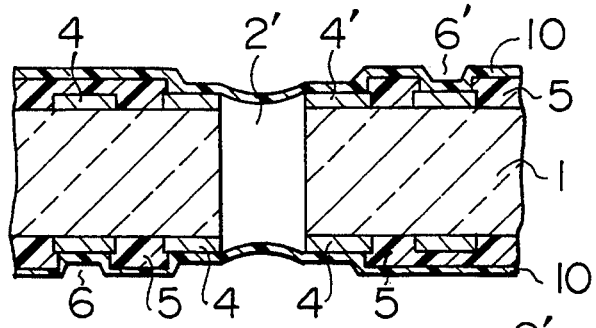

In FIG. 3(E), the resin composition for forming conductor patterns 10 of the present invention is coated on the whole surfaces of interlaminer insulating layers 5.

Figure 3F:
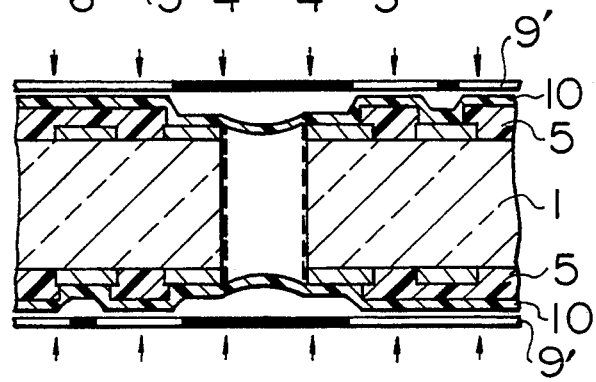

In FIG. 3(F), the resin composition layers 10 are exposed to UV light via masks 9' except for the holes 6', the hole 2' and the lands 4' to cure the resin composition layer 10.

Figure 3G:
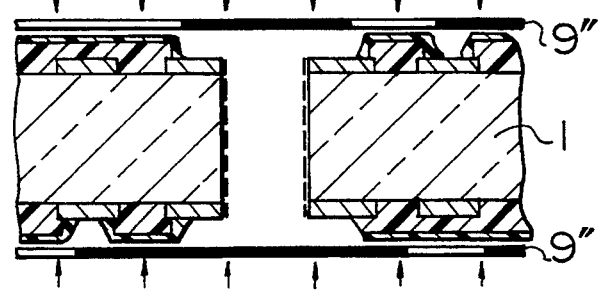
Figure 3H:
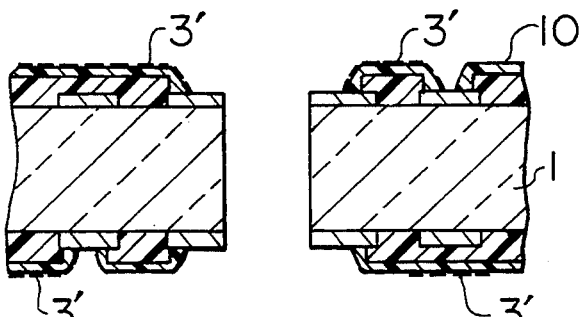

In FIG. 3(G), the cured resin layers 10 are subjected to surface roughening and coated with a solution of metal salt which becomes plating nuclea. Then, the thus treated surfaces are exposed to UV light via negative masks for second conductors 9'' to selectively form catalyst 3' corresponding to the mask patterns on the resin layers 10 (see FIG. 3(H)).

Figure 3I:
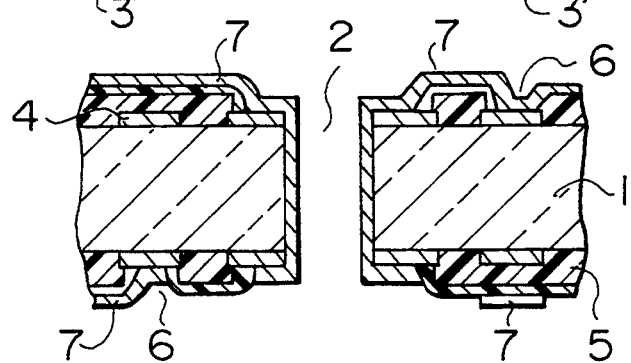

In FIG. 3(I), electroless copper plating is carried out to form second conductor layers 7 and simultaneously to form via holes 6 and through-hole 2.

By repeating the steps shown in FIGS. 3(C) to 3(I) (the steps (c) to (f)) one or more times, there can be obtained a multilayer printed circuit board having a large number of laminates.

This process is more suitable for forming finer conductor patterns.

A still further embodiment of the process for producing a multilayer printed circuit board comprises (a) drilling holes for through-holes at desired portions of a double-sided copper-clad insulating substrate and activating inner walls of the holes for electroless plating, (b) forming a first conductor layer pattern by a photo etching method, (c) forming an interlaminer insulating layer having one or more via holes and holes for through-holes by pattern-wise exposure using a photosensitive resin composition of the present invention, (d) coating a metallic ion solution for forming plating nuclea on the patterned photosensitive resin layer, which is selectively exposed to light for activation for electroless plating by reducing metalic ions on the exposed region, and (e) forming a second conductor layer pattern on the exposed region by electroless plating and forming plated via holes and plated through-holes simultaneously.

If necessary, a photo solder resist layer can be formed on the desired portions of the second conductor layers and via holes.

This process is explained referring to FIGS. 4(A) to 4(G).

FIG. 4(A) to FIG. 4(C) are the same as FIG. 1(A) to FIG. 1(C).

In FIG. 4(D), the resin composition for forming conductor patterns 10 of the present invention is used for forming interlaminer insulating layers 5. By this, the steps shown in FIG. 1 can be simplified.

In FIG. 4(E), the resin composition layers 10 are subjected to surface roughening, and coating with a solution of metal salt which becomes plating nuclea. The thus treated surfaces are exposed to UV light via negative masks 9'' for second conductor layers in the form of circuit patterns.

In FIG. 4(F), plating catalyst 3' is formed in the form of the second conductor layers.

In FIG. 4(G), electroless copper plating is carried out to form second conductor layers 7 and simultaneously to form via holes 6 and through-hole 2.

By repeating the steps shown in FIGS. 4(C) to 4(G) (the steps (c) to (e)) one or more times, there can be obtained a multilayer printed circuit board having a large number of laminates.

Figure 4:
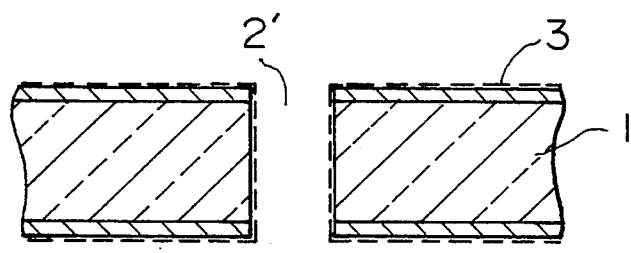
Figure 4:
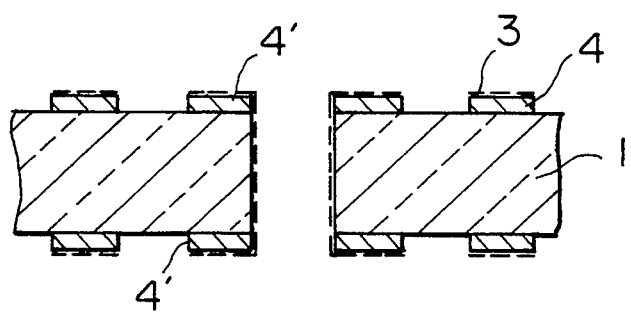
Figure 4:
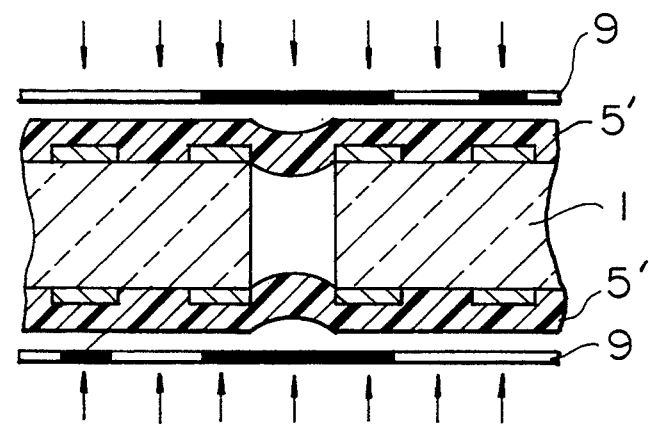
Figure 4:
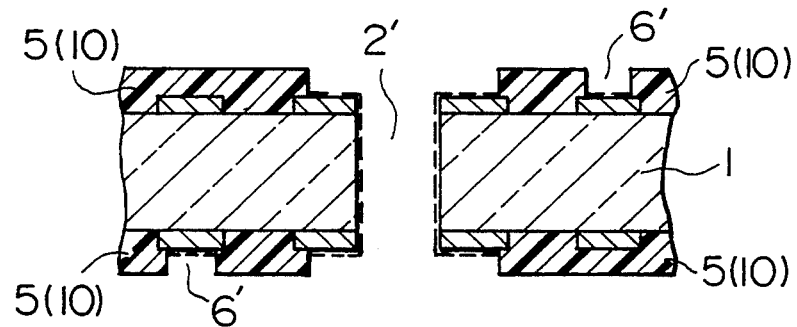
Figure 4:
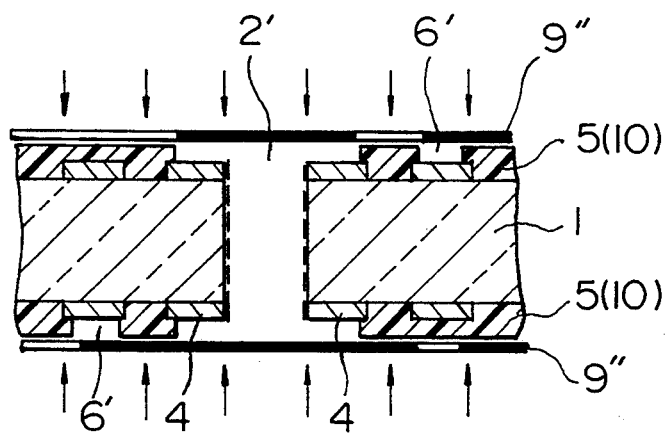
Figure 4:
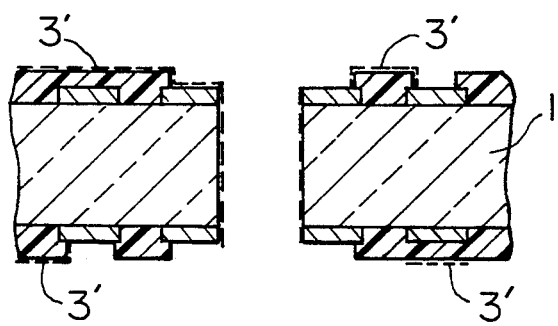
Figure 4:
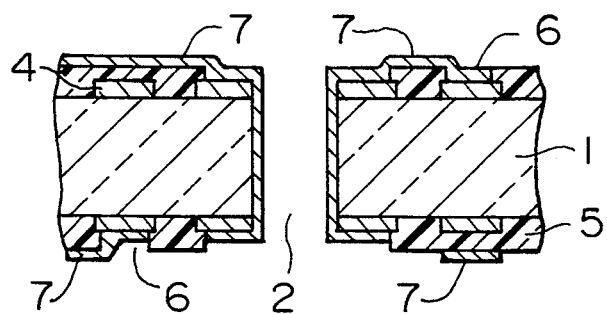

In the processes shown in FIGS. 2 to 4, a double-sided copper-clad insulating substrate (laminate) is used. But it is also possible to use an insulating substrate in place of the copper-clad laminate. In such a case, the processes shown by FIGS. 2 to 4 can be modified as follows.

For example, the process shown in FIG. 2 can be modified so as to comprise:

(a') preparing an insulating substrate having holes for through-holes at desired portions, land portions around the holes and a first conductor layer pattern connected to the land portions, (b') activating inner walls of the holes for through-holes for electroless plating, (c) forming an interlaminer insulating layer having one or more via holes and holes for through-holes by pattern-wise exposure using a photosensitive resin, (d) forming a layer of a photosensitive resin composition of the present invention for forming conductor patterns on the insulating layer except for a part of the via holes and the holes for through-holes in pattern-like, (e) coating a metallic ion solution for forming plating nuclea on the patterned photosensitive resin composition layer, which is exposed to light on the whole surface for activation for electroless plating by reducing metallic ions on the exposed region, and (f) forming a second conductor layer pattern on the exposed region by electroless plating and forming plated via holes and plated through-holes simultaneously.

If necessary, a photo solder resist layer can be formed on the desired portions of the second conductor layers and the via holes.

By repeating the steps (c) to (f) one or more times, the number of laminates can be increased depending on purposes.

The process shown in FIG. 3 can be modified so as to comprise:

(a') preparing an insulating substrate having holes for through-holes at desired portions, land portions around the holes and a first conductor layer pattern connected to the land portions, (b') activating inner walls of the holes for through-holes for electroless plating, (c) forming an interlaminer insulating layer having one or more via holes and holes for through-holes by pattern-wise exposure using a photosensitive resin, (d) forming a layer of a photosensitive resin composition of the present invention for forming conductor patterns on the insulating layer except for a part of the via holes and the holes for through-holes in pattern-like, (e) coating a metallic ion solution for forming plating nuclea on the patterned photosensitive resin composition layer, which is selectively exposed to light on a part of the surface for activation for electroless plating by reducing metallic ions on the exposed region, and (f) forming a second conductor layer pattern on the exposed region by electroless plating and forming plated via holes and plated through-holes simultaneously.

If necessary, a photo solder resist layer can be formed on the desired portions of the second conductor layers and the via holes.

By repeating the steps (c) to (f) one or more times, the number of laminates can be increased depending on purposes.

The process shown in FIG. 4 can be modified so as to comprise:

(a') preparing an insulating substrate having holes for through-holes at desired portions, land portions around the holes and a first conductor layer pattern connected to the land portions, (b') activating inner walls of the holes for through-holes for electroless plating, (c) forming an interlaminer insulating layer having one or more via holes and holes for through-holes by pattern-wise exposure using a photosensitive resin composition of the present invention, (d) coating a metallic ion solution for forming plating nuclea on the patterned photosensitive resin layer, which is selectively exposed to light for activation for electroless plating by reducing metallic ions on the exposed region, and (e) forming a second conductor layer pattern on the exposed region by electroless plating and forming plated via holes and plated through-holes simultaneously.

If necessary, a photo solder resist layer can be formed on the desired portions of the second conductor layers and the via holes.

By repeating the steps (c) to (e) one or more times, the number of laminates can be increased depending on purposes.

A still further embodiment of the process of the present invention is explained referring to FIG. 5.

Figure 5A:
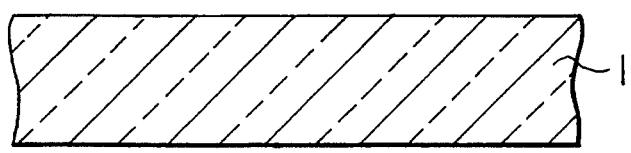
Figure 5B:
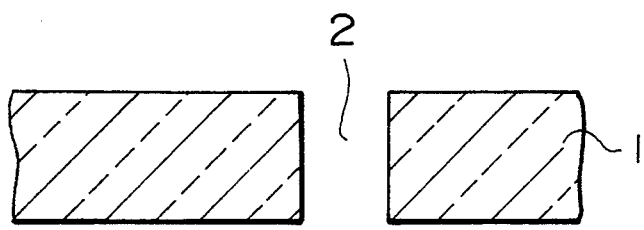

In FIG. 5(B), a hole 2' for through-hole is drilled in an insulating substrate 1.

Figure 5C:
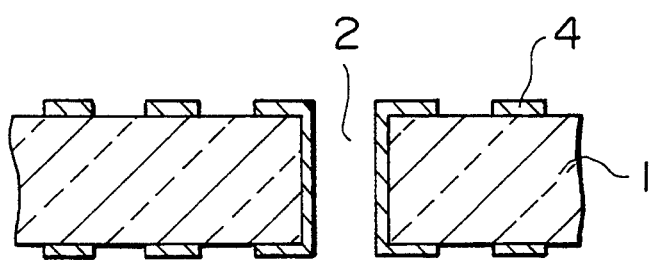

In FIG. 5(C), a through-hole 2 and first conductor layers 4 are formed, for example, by copper plating according to an additive process. It is also possible to use a double-sided copper-clad insulating substrate in place of the insulating substrate 1 and to form conductor patterns by photo etching.

Figure 5D:
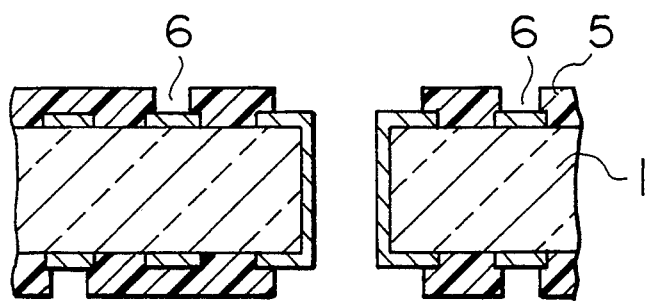

In FIG. 5(D), the photosensitive resin composition layer 5 is formed, exposed to UV light via a suitable mask, and developed to form an interlaminer insulating layer pattern 5 which is a first insulating layer except for the holes 6' and through-hole 2.

Figure 5E:
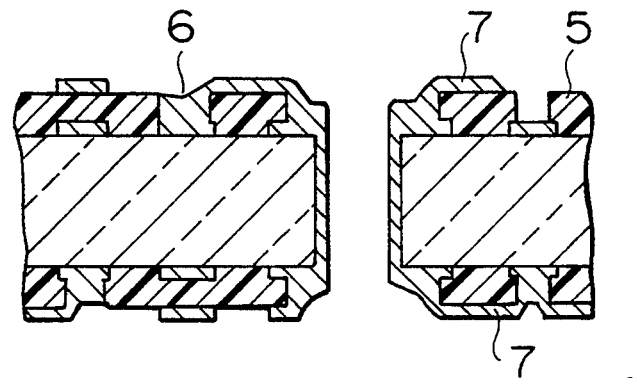

In FIG. 5(E), second conductor layers 7 are formed via first insulating layers 5. In the photosensitive resin composition 5, oxide semiconductor particles such as $TiO_2$ which can form electrons and holes by exposure to light are dispersed. After the formation of first insulating layer pattern 5, a solution of $PdCl_2$ as a source of metal ions is coated. The region for forming second conductor layer is exposed to UV light via a mask. By the light exposure, electrons generated from the oxide semiconductor reduce the metal ions $Pd^{2+}$ to metallic Pd which is deposited to form plating nucleus (which becomes plating catalyst in a later state). Then, electroless copper plating is carried out to form second conductor patterns 7 on the exposed resin layer region and exposed first conductor layer.

Figure 5F:
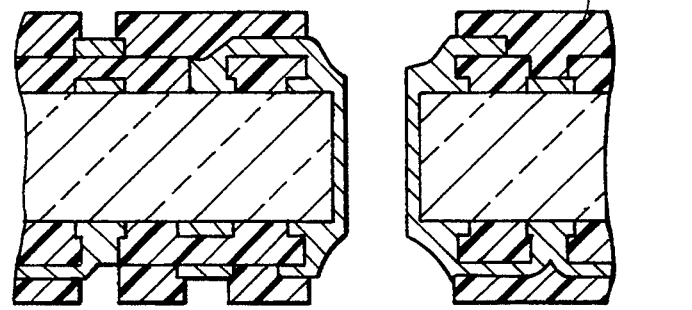
Figure 5G:
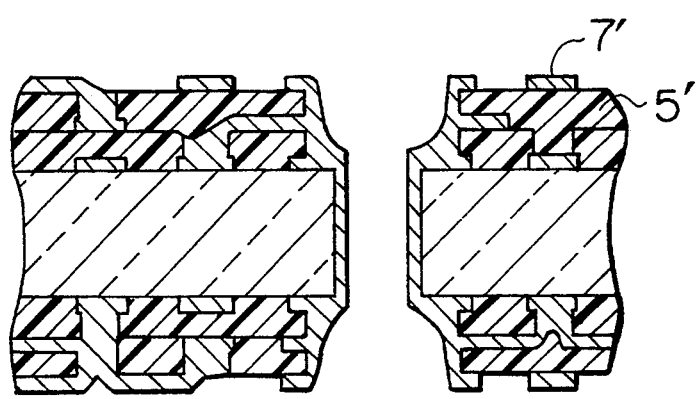

In FIGS. 5(F) and 5(G), third conductor layers 7' are formed via second insulating layers 5', principally repeating the steps of FIGS. 5(D) and 5(E).

According to the present invention, since the resin composition for forming conductor patterns contain the photo curable resin, when the resin is exposed to light in the form of pattern using a predetermined circuit pattern mask, only the exposed portions can be cured selectively. Thus, the resin can be formed into very fine circuit pattern. When the resin composition is used for forming conductor layers of high density multilayer printed circuit boards, there can easily be formed resin layers in the form of the predetermined pattern except for fine via holes and through-holes for connecting upper and lower conductor layers. Further, by exposing the photosensitive semiconductor particles contained in the resin layer to light, a plating nucleus pattern can be formed on the surface of the resin layer. Then, a conductor is formed on the plating nucleus pattern by electroless copper plating. Thus, without interfering connection of upper and lower conductors, high density conductor layers can be formed easily.

In order to form the plating nucleus pattern, the photosensitive semiconductor particles should be exposed on the surface of resin layer. Since the resin layer for forming conductor pattern contains both photo curable resin and thermosetting resin, both resins being able to be cured successively, it is possible to realize a semi-cured state of the resin composition suitable for exposing the photosensitive semiconductor particles on the resin surface by curing only the photo curable resin. After forming a conductor layer on the resin surface by electroless plating, the thermosetting resin is cured to exhibit adhesiveness suitable for practical use between the conductor layer formed and the resin layer.

Further, by bonding an electron donor to the surfaces of photosensitive semiconductor particles, or by providing an electron donor and a metal salt, photo reduction of the metal salt by electrons can be carried out effectively due to consumption of holes, which are generated on the semiconductor surface in the photo irradiation of the semiconductor particles, by the electron donor. Since a large number of plating nuclea can be formed by a low light exposure amount by this, conductor patterns can be formed stably by electroless copper plating.

In addition, since the diallyl phthalate prepolymer which is solid at room temperature is contained in the resin composition as a photocurable resin, the viscosity of the resin composition for forming conductor patterns can be adjusted properly by controlling the amount of solvent. Thus, the resin composition not only shows good coating properties but also can be cured through a mask adjacent to the resin surface since the surface of coated resin can be solidified by drying.

By using the photosensitive resin composition for forming conductor patterns of the present invention, there can be obtained the following effects.

(1) The photo curable resin makes it possible to conduct patterning of the resin layer by light exposure. Further, the photo curable resin can constitute a part or whole of the interlaminer insulating layer.

(2) The thermosetting resin functions for completing curing, for reinforcing the strength of photo curable resins, for improving resistance to electroless plating and for improving adhesiveness to plated conductor patterns.

(3) The photosensitive semiconductor particles function for releasing electrons by light exposure for reducing a metal ion to a metal at the time of forming plating nuclea.

(4) The metal salt is previously provided on photosensitive semiconductor particle surfaces, or provided on the resin pattern by coating the solution after forming the resin pattern. The metal salt is used as a source of the metal for forming plating nuclea which are formed by reducing metal ions to the metal with electrons generated from semiconductor particles upon light exposure.

(5) The electron donor consumes holes which are generated together with electrons from semiconductor particles upon light exposure, so that it can prevent recombination of the electrons and the holes. Thus, the reduction efficiency of metal ions can be enhanced.

The present invention is illustrated by way of the following Examples and Comparative Examples, in which all parts and percents are by weight, unless otherwise specified.

In the following Examples and Comparative Examples, the following electroless copper plating bath was used.

| | |
|---|---|
| $CuSO_4 \cdot 5H_2O$ | 12 g |
| EDTA.2Na | 42 g |
| NaOH | 12 g |
| Nonionic surface active agent | 0.1 g |
| $\alpha,\alpha'$-Dipyridyl | 30 mg |
| 37% Formalin | 4 ml |
| Distilled water | making the total amount 1 liter |

Further, in the following Examples and Comparative Examples, formed conductor patterns were evaluated as follows.

① Minimum conductor width
The minimum width of formed conductor pattern was measured.

② Via hole forming properties
Via holes having inner diameters of 0.3 mm and 0.9 mm were formed. When no resin was retained and connection between upper and lower conductor layers was good, this was evaluated as 0.3. On the other hand, when the connection of a part of via holes with 0.3 mm in diameter was no good but the connection of all the via holes with 0.9 mm in diameter was good, this was evaluated as 0.9.

③ Copper plating properties
: A copper conductor was formed by electroless copper plating selectively and uniformly on only the portion wherein a plating catalyst was formed.

X: Copper was not deposited or copper was partly deposited to form non-uniform conductor by electroless copper plating.

④ Adhesiveness of plated copper film
Peeling strength of plated copper film (conductor) with 25 mm thick was measured.
  X: less than 1 kg/cm
  : 1 to 2 kg/cm
  ⊙: more than 2 kg/cm

EXAMPLE 1

The following materials (v) to (vi) were used for preparing photosensitive resin compositions for forming conductor patterns.

[Photo curable resin components]
(i) Resin
Diallyl phthalate prepolymer (average molecular weight 7000)
(ii) Polyfunctional unsaturated compound
Trimethylolpropane triacrylate (3 functions)
1,6-Hexanediol diacrylate (2 functions)
Dipentaerythritol hexaacrylate (6 functions)
(iii) Photopolymerization initiator and sensitizer
2-Methyl-1-[4-(methylthio)phenyl]-2-morpholinopropane-1
4,4'-Bis(N,N'-diethylamino)benzophenone
Diethylthioxanthone
Ethyl p-dimethylaminobenzoate

[Thermosetting resin, compound exhibiting plating resistance]
(iv) Resin
Epikote 828 (a trade name, mfd. by Yuka Shell Co., Ltd., bisphenol A type epoxy resin)
Epikote 152 (a trade name, mfd. by Yuka Shell Co., Ltd., novolak type epoxy resin)
(v) Curing agent for epoxy resin
Dicyandiamide
2,4-Diamino-6[2'-ethyl-4'-methylimidazole(1')]-ethyl-s-triazine

[Plating catalyst forming substance]
(vi) Semiconductor particle
$TiO_2$ (anatase type, particle size 0.02 μm)

A photosensitive resin composition for forming conductor patterns (No. 1 in Table 1) was prepared using the components and amounts shown in Table 1. Individual components were mixed and heated at 80° C. for 30 minutes with stirring. At this time, a solvent (butyl Cellosolve acetate) and an anti-foaming agent (silicone oil) were added in proper amounts to the main components for dispersing and dissolving well in order to improve coating properties of the resin composition. Then, the resulting mixture was keaned using a three-roll will to give a resin composition for forming conductor patterns.

A glass-epoxy plate having first conductor layers on both sides thereof, holes for via holes and through-holes, and interlaminer insulating layers thereon was prepared as an insulating substrate. On the whole surfaces of the insulating layers, the above-mentioned resin composition was coated by screening in the thickness of 6 to 8 μm, followed by preliminary drying at 80° C. for 30 minutes.

The resin composition was selectively photo cured by exposing to UV light using a 400 W high pressure mercury lamp for 0.5 to 2 minutes via a mask having a predetermined pattern of second conductor layer. Then, 1,1,1-trichloroethane was sprayed to carry out development, followed by removal of the resin on non-exposed portions and formation of the resin layer pattern on the whole surface except for holes for via holes and through-holes. Then, the resin surface was roughened with a solution of 1N NaOH to expose $TiO_2$ particles, followed by formation of a plating protective resist on portions other than the conductor pattern forming portion.

Then, a 0.05% $PdCl_2$ solution was coated, and dried, and the resin pattern was directly exposed to UV light using a 400 W high pressure mercury lamp for 0.5 to 2 minutes to form Pd nuclea on the resin pattern surface. Excess $PdCl_2$ was removed by washing with water. Then, conventional electroless copper plating was carried out on the Pd nucleus formed portions to form a thin plated copper film, followed by curing with heating at 160° C. for 60 minutes.

Then, using the above-mentioned electroless copper plating bath, electroless copper plating was conducted at 70° C. for 12 hours to form conductor pattern of the desired circuit in 25 mm thick.

The thus formed conductor pattern was evaluated and listed in Table 1.

As shown in Table 1 (No. 1), the minimum conductor width was 30 μm, the adhesivenss of plated copper film was 1 kg/cm or more, and both the via hole forming properties and the copper plating properties were good.

$TiO_2$ has a large absorption in an absorption region of the same wavelength as the photopolymerization initiator used and prevents penetration of irradiated light into the resin. The photo curability of the resin was remarkably good .compared with Comparative Example 1 (No. 2) mentioned below. This is because anatase type $TiO_2$ absorbs only light of 400 nm or shorter, so that the resin can be cured by light of 400 to 450 nm and lowering of resin photo curability caused by light absorption can be complemented by $TiO_2$ which scatters light.

COMPARATIVE EXAMPLE 1

A resin composition for forming conductor patterns was prepared in the same manner as described in Example 1 using the components as listed in Table 1 (No. 2) in amounts as listed in Table 1, wherein no thermosetting resin was added and silver powder having a particle size of 0.5 μm was used as a plating catalyst. The resin composition was coated on the whole surfaces of the same insulating substrate as used in Example 1 using screening in the same manner as described in Example 1, followed by preliminary drying at 80° C. for 30 minutes.

The resin composition was selectively photo cured by exposing to UV light using a 400 W high pressure mercury lamp for 0.8 to 2 minutes via a mask having a predetermined pattern of second conductor layer. But the resin surface became sticky and adhered to the mask. Then, 1,1,1-trichloroethane was sprayed to carry out development, followed by removal of the resin on non-exposed portions. Since the silver powder prevented the penetration of irradiated light into the resin, much larger amount of light exposure was necessary for curing the resin compared with Example 1 (No. 1 in Table 1). Further, the resin was directly exposed to UV light using a 400 W high pressure mercury lamp in the range of 2 to 4 minutes.

Then, the resin surface was roughened with a 1N NaOH solution, followed by electroless plating in the same manner as described in Example 1.

The resulting conductor pattern was subjected to the same evaluation as in Example 1. The results are shown in Table 1 (No. 2).

As shown in Table 1, the minimum conductor width was 100 μm, which value was worse in resolution compared with Example 1. Lowering in resolution of the resin seemed to be caused by poor adherent light exposure properties of the resin and larger amount of light exposure at the time of photo curing of the resin. Further, the adhesiveness of plated copper film was low and the peeling strength was less than 1 kg/cm.

COMPARATIVE EXAMPLE 2

A resin composition for forming conductor patterns was prepared using Epikote 152 as the epoxy resin, an aromatic amine curing agent for the epoxy resin (EH-1013, a trade name, mfd. by Asahi Denka Kogyo K.K.), $TiO_2$ as a plating catalyst forming substance, a rubber component and a solvent as listed in Table 1 (No. 3).

On the same insulating substrate as used in Example 1 and having a hole for via hole of 0.3 mm in diameter as well as first conductor layers and interlaminer insulating layers, the resin composition was coated except for the hole for via hole in pattern form by screening. But the resin composition coated flowed into the hole for via hole to cover it so as not to form via hole.

The above-mention sample was heated at 130° C. for 30 minutes in an oven to cure the resin.

Then, the resin surface was roughened with a mixed solution of chromic acid-sulfuric acid, followed by coating with a 0.05% $PdCl_2$ solution and drying. Then, the resin layer was exposed to UV light via a negative mask for a second conductor layer to form Pd plating nucleus in the form of second conductor layer pattern. Excess $PdCl_2$ was removed by washing with water. Electroless copper plating was carried out in the same manner as described in Example 1 to form the second conductor layer.

The resulting conductor pattern was evaluated in the same manner as described in Example 1. The results are shown in Table 1 (No. 3). The Pd plating nucleus was formed by the pattern light exposure. But since the resin surface was so roughened that the resolution in Pd nucleus pattern formation was lowered. Thus, the formed conductor width was increased compared with Example 1 (No. 1 in Table 1). Further, since via hole was filled with the resin, no current-flow was obtained.

TABLE 1

| | Sample No. | 1 | 2 | 3 |
|---|---|---|---|---|
| Photo curable resin components (parts) | Diallyl phthalate prepolymer | 100 | 100 | — |
| | Trimethylolpropane triacrylate | 20 | 20 | — |
| | 2-Methyl-1-[4-(methylthio)phenyl]-2-morpholino-propane-1 | 4 | 4 | — |
| | 4,4'-Bis(N,N-diethylamino)benzophenone | 0.5 | 0.5 | — |
| Thermosetting resin components (parts) | Epikote 828 | 16 | — | — |
| | Epikote 152 | — | — | 100 |
| | Dyciandiamide | 1.6 | — | — |
| | 2,4-Diamino-6[2'-ethyl-4'-methylimidazole-(1')]ethyl-s-triazine | 0.2 | — | — |
| | EH-1013 | — | — | 33 |
| Plating catalyst forming substance (parts) | $TiO_2$ | 50 | — | 50 |
| | Silver powder | — | 100 | — |
| Properties | Minimum conductor width (μm) | 30 | 100 | 150 |
| | Via hole forming properties | 0.3 | 0.9 | 0.9 |
| | Copper plating properties | ◯ | X | X |
| | Adhesiveness of plated copper film | ◯ | X | X |

EXAMPLE 2

Resin compositions for forming conductor patterns were prepared in the same manner as described in Example 1 using the components as listed in Table 2. Conductor patterns were formed and evaluated in the same manner as described in Example 1. The results are shown in Table 2.

As shown in Table 2, when no polyfunctional unsaturated compound was added (No. 4), photo curability was extremely lowered. With an increase of the light exposure amount necessary for photo curing, resolution of resin curing was lowered, resulting in increasing of formed conductor width. When the polyfunctional unsaturated compound was added in an amount of more than 30 parts (No. 6) per 100 parts of diallyl phthalate prepolymer, the resin surface became sticky, resulting in failing to carry out adherent light exposure.

Good results were also obtained when bifunctional 1,6-hexanediol diacrylate (No. 7) and hexafunctional dipentaerythritol hexaacrylate (No. 8) were used as the polyfunctional unsaturated compound.

As to the photopolymerization initiator and photosensitizer, when their amounts were too small (Nos. 9 and 11), photo curing properties were lowered to fail to cure the resin. On the other hand, when the amounts were too much (Nos. 13 and 15), absorbance of the resin was increased, resulting in preventing the penetration of irradicated light into the bottom of the resin and causing peeling during the development. Good results were obtained in Nos. 10, 12 and 14 in Table 2.

Good results were obtained in the combinations of diethylthioxanthone and ethyl p-dimethylaminobenzoate (No. 16), benzophenone and 4,4'-bis (N,N'-diethylamino)-benzophenone (not shown in Table 2), o-benzoylbenzoic acid and 4,4'-bis (N,N'-diethylamino) benzophenone (not shown in Table 2).

TABLE 2

| | | Sample No. | 4 | 5 | 6 | 7 | 8 |
|---|---|---|---|---|---|---|---|
| Photo curable resin components (parts) | Resin | Diallyl phthalate prepolymer | 100 | 100 | 100 | 100 | 100 |
| | Polyfunctional unsaturated compound | Trimethylolpropane triacrylate | — | 10 | 35 | — | — |
| | | 1,6-Hexanediol diacrylate | — | — | — | 10 | — |
| | | Dipentaerythritol hexaacrylate | — | — | — | — | 10 |
| | Photopolymerization initiator | 2-Ethyl-1-[4-(methylthio)phenyl]-2-morpholino-propane-1 | 4 | 4 | 4 | 4 | 4 |
| | | 4,4'-Bis(N,N-diethylamino)benzophenone | 0.5 | 0.5 | 0.5 | 0.5 | 0.5 |
| | | Diethylthioxanthone | — | — | — | — | 10 |
| | | Ethyl p-dimethylaminobenzoate | — | — | — | — | 10 |
| Thermosetting resin components (parts) | Epoxy resin | Epikote 828 | 16 | 16 | 16 | 16 | 16 |
| | Curing agent | Dicyandiamide | 1.6 | 1.6 | 1.6 | 1.6 | 1.6 |
| | | 2,4-Diamino-6[2'-ethyl-4'-methyl-imidazole(1')]ethyl-s-triazine | 0.2 | 0.2 | 0.2 | 0.2 | 0.2 |
| Plating catalyst forming substance (parts) | | $TiO_2$ (anatase, particle size 0.01 µm) | 50 | 50 | 50 | 50 | 50 |
| Properties | | Minimum conductor width (µm) | 70 | 30 | *1 | 30 | 30 |
| | | Via hole forming properties | 0.9 | 0.3 | | 0.3 | 0.3 |
| | | Copper plating properties | ○ | ○ | | ○ | ○ |
| | | Adhesiveness of plated copper film | X | ○ | | ○ | ○ |

| | | Sample No. | 9 | 10 | 11 | 12 | 13 |
|---|---|---|---|---|---|---|---|
| Photo curable resin components (parts) | Resin | Diallyl phthalate prepolymer | 100 | 100 | 100 | 100 | 100 |
| | Polyfunctional unsaturated compound | Trimethylolpropane triacrylate | 20 | 20 | 20 | 20 | 20 |
| | | 1,6-Hexanediol diacrylate | — | — | — | — | — |
| | | Dipentaerythritol hexaacrylate | — | — | — | — | — |
| | Photopolymerization initiator | 2-Ethyl-1-[4-(methylthio)phenyl]-2-morpholino-propane-1 | 0.4 | 1 | — | 4 | 4 |
| | | 4,4'-Bis(N,N-diethylamino)benzophenone | — | 0.5 | 0.2 | 0.5 | 15 |
| | | Diethylthioxanthone | — | — | — | — | — |
| | | Ethyl p-dimethylaminobenzoate | — | — | — | — | — |
| Thermosetting resin components (parts) | Epoxy resin | Epikote 828 | 16 | 16 | 16 | 16 | 16 |
| | Curing agent | Dicyandiamide | 1.6 | 1.6 | 1.6 | 1.6 | 1.6 |
| | | 2,4-Diamino-6[2'-ethyl-4'-methyl-imidazole(1')]ethyl-s-triazine | 0.2 | 0.2 | 0.2 | 0.2 | 0.2 |
| Plating catalyst forming substance (parts) | | $TiO_2$ (anatase, particle size 0.01 µm) | 50 | 50 | 50 | 50 | 50 |
| Properties | | Minimum conductor width (µm) | Resin was not cured | 30 | Resin was not cured | 30 | Resin was not cured |
| | | Via hole forming properties | | 0.3 | | 0.3 | |
| | | Copper plating properties | | ○ | | ○ | |
| | | Adhesiveness of plated copper film | | ○ | | ○ | |

| | | Sample No. | 14 | 15 | 16 |
|---|---|---|---|---|---|
| Photo curable resin components (parts) | Resin | Diallyl phthalate prepolymer | 100 | 100 | 100 |
| | Polyfunctional unsaturated compound | Trimethylolpropane triacrylate | 20 | 20 | 20 |
| | | 1,6-Hexanediol diacrylate | — | — | — |
| | | Dipentaerythritol hexaacrylate | — | — | — |
| | Photopolymerization initiator | 2-Ethyl-1-[4-(methylthio)phenyl]-2-morpholino-propane-1 | 10 | 30 | — |
| | | 4,4'-Bis(N,N-diethylamino)benzophenone | 0.5 | 0.5 | — |
| | | Diethylthioxanthone | — | — | 3 |
| | | Ethyl p-dimethylaminobenzoate | — | — | 3 |
| Thermosetting resin components (parts) | Epoxy resin | Epikote 828 | 16 | 16 | 16 |
| | Curing agent | Dicyandiamide | 1.6 | 1.6 | 1.6 |
| | | 2,4-Diamino-6[2'-ethyl-4'-methyl-imidazole(1')]ethyl-s-triazine | 0.2 | 0.2 | 0.2 |
| Plating catalyst forming substance (parts) | | $TiO_2$ (anatase, particle size 0.01 µm) | 50 | 50 | 50 |

TABLE 2-continued

| Properties | Minimum conductor width (μm) | 30 | Resin | 50 |
| | Via hole forming properties | 0.3 | was | 0.3 |
| | Copper plating properties | ○ | not | ○ |
| | Adhesiveness of plated copper film | ○ | cured | ○ |

Note)
*1: Adherent light exposure was impossible.

EXAMPLE 3

Resin compositions for forming conductor patterns were prepared in the same manner as described in Example 1 using the components as listed in Table 3 (Nos. 17 to 29). Conductor patterns were formed and evaluated in the same manner as described in Example 1. The results are shown in Table 3.

As shown in Table 3, when 3 to 35 parts of the epoxy resin (per 100 parts of diallyl phthalate prepolymer), and 2 to 30 parts of a mixture of dicyandiamide and 2,4-diamino-6[2'-ethyl-4'-methylimidazole(1')]ethyl-s-triazine per 100 parts of the epoxy resin (ratio of both 4/1 to 16/1) as the curing agent were used, good results were obtained. In No. 17, since the amount of curing agent for the epoxy resin was too much, although the amount of epoxy resin was proper, the excess curing agent was released into the plating solution, resulting in lowering in the properties of plated copper film.

As to the epoxy resin, good results were obtained when bisphenol type Epikote 828 and novolak type Epikote 152 (No. 21) were used.

When 2-mercaptothiazoline as the adhesiveness improving agent for copper foil was added (No. 29), the adhesiveness of plated copper film was further improved.

EXAMPLE 4

Resin compositions for conductor patterns were prepared in the same manner as described in Example 1 using the components as listed in Table 3 (Nos. 30 to 33), while changing the amount of TiO$_2$. Conductor patterns were formed and evaluated in the same manner as described in Example 1. The results are shown in Table 3.

As shown in Table 3, when the amount of TiO$_2$ was too small, the catalyst formation became insufficient, resulting in no copper deposition on the resin in some portions. Thus the amount shown in No. 30 is the lower limit. When the amount of TiO$_2$ is lower than 10 parts, it is difficult to form good plated film. On the other hand, when the amount of TiO$_2$ is too much as shown in No. 33, photo curing of the resin becomes insufficient due to light absorption by TiO$_2$. Further, with an increase of the TiO$_2$ amount, the resolution of photo cured resin is gradually lowered, resulting in increasing of the formed conductor width.

TABLE 3

| | | Sample No. | 17 | 18 | 19 | 20 | 21 | 22 | 23 |
|---|---|---|---|---|---|---|---|---|---|
| Photo curable resin components (parts) | Resin | Diallyl phthalate prepolymer | 100 | 100 | 100 | 100 | 100 | 100 | 100 |
| | Polyfunctional unsaturated compound | Trimethylolpropane triacrylate | 20 | 20 | 20 | 20 | 20 | 20 | 20 |
| | Photopolymerization initiator | *1 | 4 | 4 | 4 | 4 | 4 | 4 | 4 |
| | | 4,4'-Bis(N,N'-diethylamino)-benzophenone | 0.5 | 0.5 | 0.5 | 0.5 | 0.5 | 0.5 | 0.5 |
| Thermosetting resin components (parts) | Epoxy resin | Epikote 828 | 3 | 10 | 24 | 35 | — | 16 | 16 |
| | | Epikote 152 | — | — | — | — | 16 | — | — |
| | Curing agent | Dicyandiamide | 1.6 | 1.6 | 1.6 | 1.6 | 1.6 | 1 | 1.4 |
| | | 2,4-Diamino-6[2'-ethyl-4'-methylimidazole(1')]ethyl-s-triazine | 0.2 | 0.2 | 0.2 | 0.2 | 0.2 | 0.05 | 0.20 |
| Copper foil adhesiveness improving agent | | 2-Mercaptothiazoline | — | — | — | — | — | — | — |
| Plating catalyst forming substance (parts) | | TiO$_2$ (anatase, particle size 0.01 μm) | 50 | 50 | 50 | 50 | 50 | 50 | 50 |
| Properties | | Minimum conductor width (μm) | 30 | 30 | 30 | 30 | 30 | 30 | 30 |
| | | Via hole forming properties | 0.3 | 0.3 | 0.3 | 0.3 | 0.3 | 0.3 | 0.3 |
| | | Copper plating properties | ○ | ○ | ○ | ○ | ○ | ○ | ○ |
| | | Adhesiveness of plated copper film | X | ○ | ○ | ○ | ○ | ○ | ○ |

| | | Sample No. | 24 | 25 | 26 | 27 | 28 |
|---|---|---|---|---|---|---|---|
| Photo curable resin components (parts) | Resin | Diallyl phthalate prepolymer | 100 | 100 | 100 | 100 | 100 |
| | Polyfunctional unsaturated compound | Trimethylolpropane triacrylate | 20 | 20 | 20 | 20 | 20 |
| | Photopolymerization initiator | *1 | 4 | 4 | 4 | 4 | 4 |
| | | 4,4'-Bis(N,N'-diethylamino)-benzophenone | 0.5 | 0.5 | 0.5 | 0.5 | 0.5 |
| Thermosetting resin components (parts) | Epoxy resin | Epikote 828 | 16 | 16 | 16 | 16 | 16 |
| | | Epikote 152 | — | — | — | — | — |
| | Curing agent | Dicyandiamide | 1.6 | 1.6 | 1.6 | 2.5 | 3 |
| | | 2,4-Diamino-6[2'-ethyl-4'-methylimidazole(1')]ethyl-s-triazine | 0.09 | 0.20 | 0.45 | 0.3 | 0.8 |
| Copper foil adhesiveness improving agent | | 2-Mercaptothiazoline | — | — | — | — | — |
| Plating catalyst forming | | TiO$_2$ (anatase, particle | 50 | 50 | 50 | 50 | 50 |

TABLE 3-continued

| substance (parts) | size 0.01 μm) | | | | | |
|---|---|---|---|---|---|---|
| Properties | Minimum conductor width (μm) | 30 | 30 | 30 | 30 | 30 |
| | Via hole forming properties | 0.3 | 0.3 | 0.3 | 0.3 | 0.3 |
| | Copper plating properties | ○ | ○ | ○ | ○ | ○ |
| | Adhesiveness of plated copper film | ○ | ○ | ○ | ○ | ○ |

| | | Sample No. | 29 | 30 | 31 | 32 | 33 |
|---|---|---|---|---|---|---|---|
| Photo curable resin components (parts) | Resin | Diallyl phthalate prepolymer | 100 | 100 | 100 | 100 | 100 |
| | Polyfunctional unsaturated compound | Trimethylolpropane triacrylate | 20 | 20 | 20 | 20 | 20 |
| | Photopolymerization initiator | *1 | 4 | 4 | 4 | 4 | 4 |
| | | 4,4'-Bis(N,N'-diethylamino)-benzophenone | 0.5 | 0.5 | 0.5 | 0.5 | 0.5 |
| Thermosetting resin components (parts) | Epoxy resin | Epikote 828 | 16 | 16 | 16 | 16 | 16 |
| | | Epikote 152 | — | — | — | — | — |
| | Curing agent | Dicyandiamide | 1.6 | 1.6 | 1.6 | 1.6 | 1.6 |
| | | 2,4-Diamino-6[2'-ethyl-4'-methylimidazole(1')]ethyl-s-triazine | 0.2 | 0.2 | 0.2 | 0.2 | 0.2 |
| Copper foil adhesiveness improving agent | | 2-Mercaptothiazoline | 3.0 | — | — | — | — |
| Plating catalyst forming substance (parts) | | TiO₂ (anatase, particle size 0.01 μm) | 50 | 10 | 50 | 100 | 200 |
| Properties | | Minimum conductor width (μm) | 30 | 30 | 30 | 50 | 90 |
| | | Via hole forming properties | 0.3 | 0.3 | 0.3 | 0.3 | *2 |
| | | Copper plating properties | ○ | ○ | ○ | ○ | |
| | | Adhesiveness of plated copper film | ⊙ | ○ | ○ | ○ | |

Note)
*1: 2-Methyl-1-[4-(methylthio)phenyl]-2-morpholino-propane-1
*2: Curing of the resin was incomplete.

EXAMPLE 5

Two kinds of amino group-containing silane coupling agents were bonded to surfaces of TiO₂ particles. In 100 ml (water:ethanol=1:1) of a 1% solution of 3-aminopropyltriethoxysilane (APS), 10 g of TiO₂ powder (anatase, particle size 1 μm) was placed and stirred for 2 hours. After filtering, thus treated TiO₂ was dried under reduced pressure to remove the solvent, followed by drying at 80° C. for 1 hour to fix the coupling agent. In the same manner as mentioned above, 3-(2-aminoethyl-)aminopropyltrimethoxysilane (AAPS) was bonded to surfaces of TiO₂ particles.

Resin compositions for forming conductor patterns were prepared in the same manner as described in Example 1 using the thus treated TiO₂ particles or non-treated TiO₂ and the components as listed in Table 4.

Using the resin compositions, conductor patterns were formed on glass-epoxy plates in the same manner as described in Example 1. During the pattern formation, Pd plating nuclei were formed by changing light exposure amounts, followed by electroless copper plating using the same electroless copper plating bath as used in Example 1. Then, minimum light exposure amount necessary for forming the Pd plating nuclei required for copper deposition was measured. Further, the minimum conductor pattern width, the adhesiveness and the copper plating properties were also evaluated in the same manner as described in Example 1. The results are shown in Table 4.

As is clear from Table 4, when TiO₂ is contained in the samples in the effective range (10 to 150 parts), the sensitivity for forming the Pd plating nuclei is increased by bonding the coupling agent to the surfaces of TiO₂ particles. For example, when 50 parts of TiO₂ per 100 parts of diallyl phthalate prepolymer was contained (Nos. 34 to 36), UV light exposure amount of 200 mJ/cm² or more was necessary for depositing copper on the resin layer containing non-treated TiO₂ (No. 34). In contrast, the UV light exposure amount was 140 mJ/cm² or more for depositing copper on the resin layer containing APS treated TiO₂(No. 35), and 100 mJ/cm² or more for depositing copper on the resin layer containing AAPS treated TiO₂ (No. 36). The AAPS treated TiO₂ showed higher sensitivity than the APS treated TiO₂. This seems to be that AAPS has two amine moieties in one molecule, while APS has one amine moiety in one molecule, resulting in making the amine density on TiO₂ surface higher in the case of AAPS than that in the case of APS.

Further, it should be noted that when the APS treated TiO₂ and the AAPS treated TiO₂ are used, the adhesiveness of plated copper film is as good as more than 2 kg/cm.

TABLE 4

| | Sample No. | 34 | 35 | 36 | 37 | 38 | 39 | 40 |
|---|---|---|---|---|---|---|---|---|
| Photo curable resin components (parts) | Diallyl phthalate prepolymer | 100 | 100 | 100 | 100 | 100 | 100 | 100 |
| | Trimethylolpropane triacrylate | 20 | 20 | 20 | 20 | 20 | 20 | 20 |
| | 2-Methyl-1-[4-(methylthio)-phenyl]-2-morpholino-propane-1 | 8 | 8 | 8 | 8 | 8 | 8 | 8 |
| | 4,4'-Bis(N,N-diethylamino)-benzophenone | 0.5 | 0.5 | 0.5 | 0.5 | 0.5 | 0.5 | 0.5 |
| Thermosetting | Epikote 828 | 16 | 16 | 16 | 16 | 16 | 16 | 16 |
| | Dicyandiamide | 1.6 | 1.6 | 1.6 | 1.6 | 1.6 | 1.6 | 1.6 |

TABLE 4-continued

| | Sample No. | | 34 | 35 | 36 | 37 | 38 | 39 | 40 |
|---|---|---|---|---|---|---|---|---|---|
| resin components (parts) | 2,4-Diamino-6[2'-ethyl-4'-methylimidazole(1')]-ethyl-s-triazine | | 0.2 | 0.2 | 0.2 | 0.2 | 0.2 | 0.2 | 0.2 |
| Plating catalyst forming substance (parts) | TiO$_2$ anatase, particle size 1 μm | non-treated | 50 | — | — | 20 | — | 75 | — |
| | | APS treated | — | 50 | — | — | — | — | — |
| | | AAPS treated | — | — | 50 | — | 20 | — | 75 |
| Properties | Minimum light exposure amount for depositing copper (mJ/cm$^2$) | | 200 | 140 | 100 | 400 | 200 | 150 | 70 |
| | Minimum conductor width (μm) | | 65 | 65 | 65 | 50 | 50 | 80 | 80 |
| | Copper plating properties | | ○ | ○ | ○ | ○ | ○ | ○ | ○ |
| | Adhesiveness of plated copper film | | ○ | ◉ | ◉ | ○ | ◉ | ○ | ◉ |

EXAMPLE 6

Using the resin composition for forming conductor patterns (No. 36 shown in Table 4), a four-layer printed circuit board was produced by the steps shown in FIG. 2(A) to FIG. 2(I).

According to the procedures shown in FIGS. 2(A) to 2(D), first conductors and interlaminer insulating layers formed thereon were formed as follows.

As a substrate, there was used a glass-epoxy copper-clad laminate of 1.5 mm thick having copper foil thickness of 35 μm on both sides. Holes 2' for through-holes having an inner diameter of 0.9 mm were drilled. Then, the substrate was dipped in a catalyst solution of Sn/Pd to adhere an activating catalyst 3 to the surfaces of copper foils and inner walls of the holes. Then, a dry film which was a kind of resist was laminated on the substrate according to a conventional method. Lands 4' and first conductor layers 4 were formed according to a tenting method including steps of light exposure, development, etching and peeling.

Then, a photo polymer having the following composition was coated on the whole surfaces of the substrate by a screen printing method in the thickness of 100 μm, followed by preliminary drying at 80° C. for 60 minutes. Then, the substrate was subjected to exposure to UV light of 1000 mJ/cm$^2$ via a mask, and development with 1,1,1-trichloroethane to form interlaminer insulating layers 5 having holes 6' for via holes having an inner diameter of 200 μm.

| <Photo polymer composition> | |
|---|---|
| (i) Diallyl phthalate prepolymer | 100 g |
| (ii) Trimethylolpropane trimethacrylate | 20 g |
| (iii) Epoxy resin (Epikote 828) | 16 g |
| (iv) Dicyandiamide | 1.6 g |
| (v) 2,4-Diamino-6[2'-methylimidazole(1')]-ethyl-s-triazine | 0.2 g |
| (vi) Silicone oil SH-203 | 3.0 g |
| (vii) SiO$_2$ ultrafine powder | 3.0 g |
| (viii) Phthalocyanine Green | 1.0 g |
| (ix) Ethylene glycol monobutyl ether | 50 g |

As shown in FIGS. 2(E) to 2(I), the resin composition (No. 36 in Table 4) was coated on the whole surfaces of the interlaminer insulating layers 5 by screening in the thickness of 5 μm (FIG. 2E)). After preliminary drying at 80° C. for 30 minutes, the resulting substrate was subjected to exposure to UV light (arrowed directions) of 500 mJ/cm$^2$ via a negative mask 9' for second conductor (FIG. 2(F)), and development with 1,1,1-trichloroethane to form resin patterns 10 in the form of the second conductor layer except for the holes for via holes and through-holes (FIG. 2(G)).

The resulting sample was cured with heating at 160° C. for 60 minutes, followed by roughening of the conductor formed resin patterns 10 with 1M NaOH aqueous solution. On the thus treated surfaces, a 0.05% PdCl$_2$ solution was coated, dried and exposed to UV light of 100 mJ/cm$^2$ to form Pd plating nuclea (catalyst) patterns 3' on the conductor formed resin patterns (FIG. 2(H)). Excess PdCl$_2$ was removed by washing with water. Then, using the electroless copper plating bath as used in Example 1, second conductor layers 7 with conductor width of 60 μm and via holes 6 and through-holes 2 were simultaneously formed by electroless copper plating (FIG. 2(E)).

Finally, photo solder resists 8 were formed except for the through-holes as shown in FIG. 1(F) to yield four-layered printed circuit board.

As mentioned above, since the resin composition for forming conductor patterns of the present invention contains the photo curable resin, very fine resin patterns can be formed by the pattern light exposure. Further, since the photosensitive semiconductor particles contained in the resin composition can form plating nuclea on the resin layer surface by exposure to light, conductor patterns can easily be formed on the resin layer surface by electroless plating. Therefore, conductor layers can be formed without damaging current-flow between upper and lower conductors to produce high density multilayer printed circuit boards having very fine via holes and through-holes.

Further, since the resin composition for forming conductor patterns contains both photo curable resin and thermosetting resin, it can provide not only stable formation of the plating nuclea but also practically usable strong adhesiveness between the conductor layers formed by electroless plating and the resin layer.

In addition, since diallyl phthalate prepolymer which is solid at room temperature is contained in the resin composition of the present invention, it can provide not only good coating properties to the resin composition but also good adherent light exposure using a mask pattern at the time of photo curing of the resin, resulting in making possible conductor pattern formation for printed circuit boards with a large area. Moreover since the cured layer of the resin composition of the present invention per se has good insulating properties and good adhesiveness to the conductor patterns, it is possible to produce multilayer printed circuit boards with high reliability.

What is claimed is:

1. A photosensitive resin composition for forming conductor patterns comprising 100 parts by weight of a photo curable resin, 0 to 30 parts by weight of a polyfunctional unsaturated compound, 0.5 to 12 parts by weight of a photopolymerization initiator, 3 to 35 parts by weight of a thermosetting resin, 2 to 30 parts by weight, per 100 parts by weight of the thermosetting resin, of a curing agent for the thermosetting resin, and 10 to 150 parts by weight of photosensitive semiconductor particles which form plating catalyst for electroless plating at time of forming conductor patterns.

2. A composition according to claim 1, wherein the photo curable resin is a diallyl phthalate prepolymer, and the polyfunctional unsaturated compound is a compound having at least two ethylenic linkages in the molecule.

3. A composition according to claim 2, wherein the diallyl phthalate prepolymer is at least one of diallyl orthophthalate prepolymer and diallyl isophthalate prepolymer, and/or diallyl terephthalate prepolymer, and has a molecular weight of 3000 to 30,000.

4. A composition according to claim 2, wherein the polyfunctional unsaturated compound is at least one member selected from the group consisting of compounds obtained by esterification of an unsaturated carboxylic acid with a dihydric or higher polyhydric polyhydroxy compound, epoxy resin acrylates and epoxy resin methacrylates.

5. A composition according to claim 1, wherein the thermosetting resin is an epoxy resin.

6. A composition according to claim 3, wherein the epoxy resin is at least one member selected from the group consisting of bisphenol epoxy resins and novolak epoxy resins.

7. A composition according to claim 3, wherein the curing agent for the epoxy resin is at least one member selected from the group consisting of aromatic polyamines, imidazole compounds, acid anhydrides, dicyandiamide, diaminotriazine modified imidazoles and organic acid hydrazides.

8. A composition according to claim 1, wherein the photosensitive semiconductor particles are those generating electrons and holes on exposure to light, said generated electrons having a function of reducing metallic ions and depositing a metal so as to act as a plating nucleus pattern.

9. A composition according to claim 8, wherein the photosensitive semiconductor particles have on their surfaces electron donors which consume holes which are generated at the time of exposure to light together with electrons.

10. A composition according to claim 9, wherein the electron donor is directly bonded to or bonded via a coupling agent to surfaces of the photosensitive semiconductor particles, said electron donor being at least one member selected from the group consisting of amines, alcohols, cyclic ethers, lower aliphatic carboxylic acids and nitriles.

11. A composition according to claim 10, wherein the coupling agent is an amino group-containing silane coupling agent.

12. A composition according to claim 1, wherein the curing agent for thermosetting resin is at least one member selected from the group consisting of diaminotriazine modified imidazole and dicyandiamide.

13. A composition according to claim 1, which further comprises 1 to 35 parts by weight of an adhesive improving agent which can improve adhesiveness to a conductor pattern formed by electroless plating per 100 parts by weight of the epoxy resin.

14. A composition according to claim 13, wherein the adhesive improving agent is at least one member selected from the group consisting of thiazoline compounds, thiazole compounds, thiadiazole compounds, imidazole compounds, and imidazoline compounds.

15. A composition according to claim 1, wherein the photosensitive semiconductor particles are at least one member selected from the group consisting of $TiO_2$, ZnO and CdS.

16. A photosensitive resin composition for forming conductor patterns comprising
   100 parts by weight of diallyl phthalate prepolymer as a photo curable resin,
   4 to 35 parts by weight of a polyfunctional unsaturated compound,
   0.5 to 12 parts by weight of a photopolymerization initiator,
   3 to 35 parts by weight of an epoxy resin as a thermosetting resin,
   10 to 150 parts by weight of photosensitive semiconductor particles which form plating catalyst for electroless plating at time of forming conductor patterns, and
   2 to 30 parts by weight of a curing agent for the epoxy resin per 100 parts by weight of the epoxy resin.

* * * * *